(12) United States Patent
Wright

(10) Patent No.: US 7,112,793 B2
(45) Date of Patent: *Sep. 26, 2006

(54) ONE-CHIP COMPASS IMPLEMENTED USING MAGNETORESISTIVE (MR) SENSOR TEMPERATURE COMPENSATION AND MAGNETIC CROSS-TERM REDUCTION TECHNIQUES

(75) Inventor: Layne L. Wright, Denver, CO (US)

(73) Assignees: Laser Technology, Inc., Centennial, CO (US); Kama-Tech (HK) Ltd., Hong Kong (CN)

( * ) Notice: Subject to any disclaimer, the term of this patent is extended or adjusted under 35 U.S.C. 154(b) by 27 days.

This patent is subject to a terminal disclaimer.

(21) Appl. No.: 11/025,740

(22) Filed: Dec. 22, 2004

(65) Prior Publication Data

US 2005/0150295 A1 Jul. 14, 2005

Related U.S. Application Data

(63) Continuation-in-part of application No. 10/751,806, filed on Jan. 5, 2004.

(51) Int. Cl.
*G11B 5/86* (2006.01)
(52) U.S. Cl. .................. 250/338.2; 73/504.04
(58) Field of Classification Search ............. 250/338.2, 250/338.1; 73/504.04; 600/585, 500
See application file for complete search history.

(56) References Cited

U.S. PATENT DOCUMENTS

2005/0145795 A1* 7/2005 Wright .................... 250/338.2

OTHER PUBLICATIONS

Flynn, David, A Vector Magnetometer using a Single Permalloy Sensor with Dual Magnetic Feedback, IEEE Transactions on Magnetics, vol. 30, No. 6, Nov. 1994, pp. 5038-5041.

Fluitman, J.H.J., The Influence of Sample Geometry on the Magnetoresistance of Ni-Fe Films, Thin Solid Films, 16 (1973), pp. 269-276.

Kaplan, Ben-Zion, Paperno, Eugene, Flynn, David I., In-Plane Vector Magnetometer Employing a Single Unbiased Magnetoresistor, IEEE Transactions on Magnetics, vol. 34, No. 1, Jan. 1998, pp. 253-258.

Flynn, David I., A New Technique of Noise Reduction for Large Aspect Magnetoresistors, IEEE Transactions on Magnetics, vol. 30, No. 3, May 1994, pp. 1263-1266.

(Continued)

*Primary Examiner*—Otilia Gabor
(74) *Attorney, Agent, or Firm*—William J. Kubida; Kent A. Lembke; Hogan & Hartson LLP

(57) ABSTRACT

A measurement technique for normalizing the sensitive-axis output of a magnetoresistive (MR) sensor which greatly reduces both temperature effects and magnetic contributions from the insensitive-axis cross-terms. Specifically, the normalization techniques disclosed may be effectuated by direct measurement with no prior knowledge of the sensor constants being required and may be performed for a single sensor with multiple sensors not being required in order to estimate the cross-axis fields for each of the other sensors. The technique can additionally provide an output proportional to the insensitive-axis field as well as that of the sensitive-axis and, when combined with knowledge of ambient field strengths, can be used to determine fundamental MR sensor constants which then allows for correction of higher-order sensor non-linearities. The techniques disclosed are particularly conducive to low power supply availability applications such as battery operation.

20 Claims, 18 Drawing Sheets

OTHER PUBLICATIONS

Paperno, Eugene, Kaplan, Ben-Zion, Simultaneous Measurement of Two DC Magnetic Field Components by a Single Magnetoresistor, IEEE Transactions on Magnetics, vol. 31, No. 3, May 1995, pp. 2269-2273.

Pant, Bharat B., Caruso, Mike, Magnetic Sensor Cross-Axis Effect, Honeywell, Apr. 1996, 6 pages.

Caruso, Michael J. Bratland, Tamara, Smith, Carl H., Schneider, Robert, A New Perspective on Magnetic Field Sensing, Honeywell, Inc., May 1998, pp. 1-19.

Magnetoresistive sensors for magnetic field measurement, Philips Semiconductors, Sep. 6, 2000, pp. 15-20.

* cited by examiner

2

ONE-CHIP COMPASS IMPLEMENTED USING MAGNETORESISTIVE (MR) SENSOR TEMPERATURE COMPENSATION AND MAGNETIC CROSS-TERM REDUCTION TECHNIQUES

CROSS-REFERENCE TO RELATED APPLICATIONS

This application is a continuation-in-part of application Ser. No. 10/751,806, filed Jan. 5, 2004, which is incorporated herein in its entirety by reference.

COPYRIGHT NOTICE/PERMISSION

A portion of the disclosure of this patent document contains material which is subject to copyright protection. The copyright owner has no objection to the facsimile reproduction by anyone of the patent document of the patent disclosure as it appears in the United States Patent and Trademark Office patent file or records, but otherwise, reserves all copyright rights. The following notice applies to the software and data and described below, inclusive of the drawing figures where applicable: Copyright© 2003 Laser Technology, Inc.

BACKGROUND OF THE INVENTION

The present invention relates, in general, to the field of magnetoresistive (MR) sensors and the utilization of the same as magnetometers and magnetic compasses. More particularly, the present invention relates to effective, simplified and highly accurate techniques for MR sensor temperature compensation and magnetic cross-term reduction in conjunction with conventional magnetoresistive sensor designs.

There are a number of conventional magnetic sensor designs and techniques for utilizing them in compassing, navigational systems and other applications currently available. In this regard, representative references include: Caruso et al., "*A New Perspective on Magnetic Field Sensing*" published by Honeywell, Inc. May, 1998 (hereinafter "New Perspectives"),.; a Honeywell Sensor Products Datasheet for the HMC1001/1002 and HMC1021/1022 1- and 2-Axis Magnetic Sensors published April, 2000 (hereinafter "Honeywell Datasheet"); a Honeywell Application Note AN-205 entitled "*Magnetic Sensor Cross-Axis Effect*" by Pant, Bharat B. (hereinafter "AN-205"); and a Philips Semiconductors publication entitled: "Magnetoresistive Sensors for Magnetic Field Measurement", published Sep. 6, 2000 (hereinafter "Philips Publication"). The disclosures of these references are herein specifically incorporated by this reference in their entirety.

Specifically, the New Perspectives document provides an overview of magnetoresistive and other magnetic sensing technologies while the Honeywell Datasheet provides a detailed description of the particular MR sensors as may be utilized in a representative embodiment of the present invention disclosed herein. The AN-205 application note describes conventional techniques for the elimination of magnetic cross-terms in magnetoresistive sensors while the Philips Publication provides a detailed description of MR sensor functionality including relevant mathematics.

SUMMARY OF THE INVENTION

Disclosed herein is a measurement technique used to normalize the sensitive-axis output of a MR sensor which greatly reduces both temperature effects and magnetic contributions from the insensitive-axis cross-terms. Among other significant advantages of the normalization technique disclosed are: a) it may be effectuated by direct measurement with no prior knowledge of the sensor constants being required; b) the technique may be performed for a single sensor and multiple sensors are not needed in order to estimate the cross-axis fields for each of the other sensors; c) the technique can additionally provide an output proportional to the insensitive-axis field as well as that of the sensitive-axis; d) when combined with knowledge of ambient field strengths, the technique can be used to determine fundamental MR sensor constants which then allows for correction of higher-order sensor non-linearities; and e) the technique is conducive to low power supply availability applications such as battery operation.

Particularly disclosed herein is a method for normalizing an output of the sensitive axis of a magnetic sensor having SET/RESET/OFFSET field generating elements. The output is substantially determined by a method comprising: sampling a number of SET outputs of the sensor to produce a first sum; sampling a number of RESET outputs of the sensor to produce a second sum; sampling a number of SET gains of the sensor to produce a third sum; sampling a number of RESET gains of the sensor to produce a fourth sum; subtracting the second sum from the first sum to produce a first result; subtracting the fourth sum from the third sum to produce a second result; and dividing the first result by the second result.

Further disclosed herein is a method for determining the cross-axis output of the insensitive axis of a magnetic sensor having SET/RESET/OFFSET field generating elements. The cross-axis output is, substantially determined by: sampling a number of SET gains of the sensor to produce a first sum; sampling a number of RESET gains of the sensor to produce a second sum; adding the first sum to the second sum to, produce a first result; subtracting the second sum from the first sum to produce a second result; and dividing the first result by the second result.

Also disclosed herein is a method for normalizing an output of the sensitive axis of a magnetic sensor having SET/RESET and OFFSET field generating elements. The output is substantially determined by a method comprising: furnishing a pulse having a first direction to the SET/RESET field generating element to establish a SET magnetic state; sampling an output of the magnetic sensor to establish a SET magnetic output; providing a pulse having the first direction to the OFFSET field generating element; sampling the output of the magnetic sensor to establish a first sample; providing another pulse having a second direction opposite to the first direction to the OFFSET field generating element; further sampling the output of the magnetic sensor to establish a second sample; and subtracting the second sample from the first sample to establish a SET gain.

Also further disclosed herein is a circuit comprising: a magnetic sensor having first and second terminals thereof; SET/RESET field generating elements disposed at a first location with respect to the magnetic sensor; OFFSET field generating elements disposed at a second location with respect to the magnetic sensor so as to generate a field orthogonal to that generated by the SET/RESET field generating elements; an amplifier coupled to the first and second terminals of the magnetic sensor and having an output thereof; an A/D converter coupled to the output of the amplifier for producing a control signal; a SET/RESET pulse generator coupled to the SET/RESET field generating elements; an OFFSET generator coupled to the OFFSET field generating elements; and a control block adapted to receive the control signal from the A/D converter and providing control output signals to the SET/RESET pulse generator and the OFFSET generator.

According to another aspect of the invention a method is provided for operating one MR chip as a compass, which typically requires two orthogonally mounted chips to implement. A single chip magnetic sensor includes SET/RESET field generating elements, and the method includes collecting measurements to create a sensitive-axis output as would be required for each of the individual chips in a 2-chip system. A nearly orthogonal cross-axis output, however, is also additionally synthesized using similar measurements as used to create the sensitive-axis, and then compassing computations proceed using this new cross-axis output in place of the sensitive-axis output normally provided by the second orthogonal chip. The cross-axis output is determined by sampling SET gains of the sensor to product a first sum and sampling RESET gains of the sensor to produce a second sum. The first and second sums are added to product a first result, and then, the second sum is subtracted from the first sum to produce a second result. The cross-axis output is then determined by dividing the first result by the second result. Further, the method may include normalizing the sensitive axis outputs, such as with the processes described above for a 2-chip device.

According to yet another aspect of the invention a circuit is provided for use as a 1-chip compass. The circuit includes an MR sensor having first and second terminals and a sensitive and a cross-axis. SET/RESET field generating elements are disposed at a first location relative to the MR sensor. OFFSET field generating elements are disposed at a second location in the circuit so as to generate a field substantially orthogonal to that generated by the SET/RESET field generating elements. An amplifier is couple to the first and second terminals, and A/D converter is coupled to the output of the amplifier. A SET/RESET pulse generator is coupled in the circuit to the SET/RESET field generating elements, and an OFFSET generator is coupled to the OFFSET field generating elements.

A control block is provided in the circuit that receives the control signal from the A/D converter and provides control output signals to the SET/RESET pulse generator and the OFFSET generator. Significantly, the control block is further adapted to perform compassing processes based on MR sensor outputs for the sensitive axis and outputs determined for the cross-axis. The cross-axis output may be determined as discussed above and also, the sensitive axis outputs may be normalized as discussed above to compensate for temperature effects in the 1-chip compass circuit.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 12A and 12B show the effects that sensitive and cross-axis fields have on the SET-RESET gain difference wherein FIG. 12A illustrates that the normalized SET-RESET gain increases with the applied cross-axis field and FIG. 12B illustrates that the normalized SET-RESET gain difference decreases with the sensitive-axis field;

DESCRIPTION OF A REPRESENTATIVE EMBODIMENT

Figure 1:
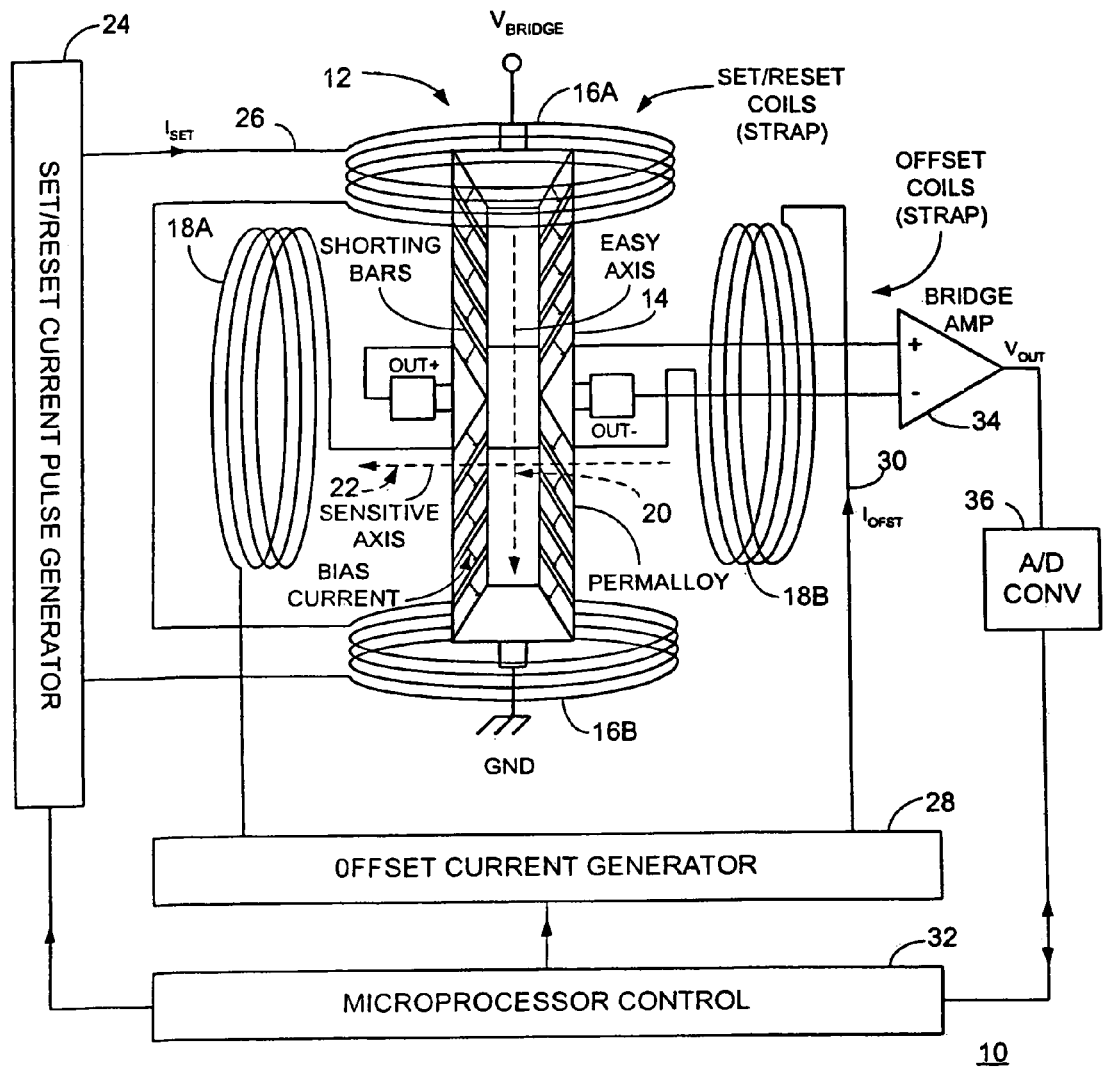
FIG. 1 is a simplified representation of an MR bridge utilizing SET/RESET and OFFSET coils (or straps) to effectuate the magnetoresistive sensor temperature compensation and magnetic cross-term reduction techniques of the present invention.

With reference now to FIG. 1, a schematic representation of a 'barber-pole' type magnetoresistive (MR) bridge 10 is shown, along with the coils (or straps) 16A, 16B, 18A and 18B used to generate both the SET/RESET and OFFSET fields in order to effectuate the magnetoresistive sensor 12 temperature compensation and magnetic cross-term reduction techniques of the present invention.

The sensor 12, in general, comprises a substantially elongate permalloy body portion 14 which includes a number of shorting bars between which are induced a bias current in the direction indicated by the arrows. The sensor 12, in conjunction with the opposing SET/RESET coils (or straps) 16A and 16B and OFFSET coils (or straps) 18A and 18B defines an easy axis 20 extending between the coils 16A and 16B and a sensitive axis 22 extending between the coils 18A and 18B. The MR bridge 10 may be, in a representative embodiment, coupled between a voltage $V_{BRIDGE}$ and circuit ground as shown.

In accordance with the present invention, the MR bridge 10 further includes a SET/RESET current pulse generator 24 for applying a current $I_{SET}$ on line 26 to the series coupled SET/RESET coils 16A and 16B as will be more fully described hereinafter. Similarly, an OFFSET current generator 28 supplies a current $I_{OFST}$ on line 30 to the series coupled OFFSET coils 18A and 18B as will also be more fully described hereinafter. The function of the SET/RESET current pulse generator 24 and OFFSET current generator 28 is in accordance with direction received from a microprocessor control block 32. Positive and negative output from the sensor 12 is supplied to a bridge amplifier 34 which produces a voltage output $V_{OUT}$ for input to an analog-to-digital (A/D) converter 36 which is, in turn, coupled to the microprocessor control block 32.

Although illustrated as such for sake of simplicity, in practice, actual coils are seldom used. Instead conductive straps are integrated directly onto the MR chip to serve as the field generators and the coils are utilized in this figure to illustrate field directions, via the right-hand rule, generated by specific currents. The circuit shown is only a representative topology implemented in the form of a constant-voltage bridge and it should be noted that a constant-current bridge configuration may also be implemented (or a design utilizing a combination of voltage and current methods) which may also be used to effectuate the sensor temperature compensation and magnetic cross-term reduction technique of the present invention.

With particular reference to AN-205, an experimentally verified representation for a "barber-pole" MR bridge sensor output, valid for either a constant-voltage or constant-current bridge, is given by equation (1) on page 1:

$$V_{OUT}=(aH)/(Hs+Hca),$$

where 'Vos', the (null) offset, has been removed;
  'H' is the sensitive-axis field;
  'Hca' is the cross-axis field;
  'a' is a function of the anisotropic magnetoresistance constant, '$\Delta\rho/\rho$', and bulk resistivity '$\rho$'; and
  'Hs=Hk+Hd' is a sensor constant (denominated as 'Ho' by the Philips Publication), equal to the sum of the anisotropy and demagnetizing fields.

Typically, '$\Delta\rho/\rho$' and '$\rho$' are the dominant sources of temperature variation, while 'Ho' varies weakly with temperature due to the small temperature dependency of 'Hk'. Hence it is mathematically useful to generalize the AN-205 expression for $V_{OUT}$ into the following form:

$$V_{OUT}=CO+Cl[T]FH[H,Hca,Ho], \text{ where}$$

'CO' is derived from a now restored 'Vos'; Cl[T] is a function of temperature dependent on circuit topology combined with '$(\Delta\rho/\rho)$ [T]' and '$\rho$[T]'; 'Ho' is now considered independent of temperature unless otherwise noted or inferred; and 'FH[H,Hca,Ho]' represents some approximation for the actual magnetic form-factor of a 'barber-pole' magnetoresistor, which cannot be written in closed form, but can be solved numerically.

The magnetic form-factor specifically associated with the AN-205 application note 'Vout' approximation is well suited to illustrating the techniques of the present invention, as it is simple enough to allow meaningful symbolic expressions to be derived:

$$FH[H,Hca,Ho]\cong(H/(Hca+Ho)) \text{ [AN-205 Form-Factor]}$$

Note also the form-factors for the SET and RESET magnetic states are generally derived by changing the sign changes of 'Ho' (+Ho for SET state, and –Ho for RESET state):

$$FH[H,Hca,+Ho] \text{ for the 'SET' magnetic state}$$

$$FH[H,Hca,-Ho] \text{ for the 'RESET' magnetic state}$$

As shown, a current pulse '$I_{SET}$' injected into the SET/RESET coils 16A, 16B on line 26 will generate a domain aligning field parallel with the 'easy-axis' 20 vector, placing the MR bridge 10 in the SET magnetic state. Conversely, a current pulse in the opposite direction generates a field anti-parallel to the easy-axis 20, toggling the bridge 10 to the RESET magnetic state. When in the SET state, the MR bridge 10 produces a positive voltage with respect to the zero-field bridge OFFSET voltage, '$V_{OS}$', for fields parallel to the sensitive-axis 22. When toggled to the RESET state, '$V_{OUT}$' will go negative with respect to '$V_{OS}$' by approximately the same amount.

The OFFSET coils 18A, 18B are used to perturb the ambient sensitive-axis 22 field in order to make differential gain measurements about that field point. A small current '$I_{OFST}$' injected into the OFFSET coils 18A and 18B on line 30 will augment the sensitive axis 22 field, and a current pulse in the opposite direction will retard the sensitive axis 22 field.

These differential gain measurements, when mathematically combined with the ambient field measurements, allow for the creation of a normalized sensitive-axis 22 output in which both temperature and magnetic contributions from the insensitive-axis (aligned with the 'easy'-axis 20) are greatly reduced.

Figure 2:
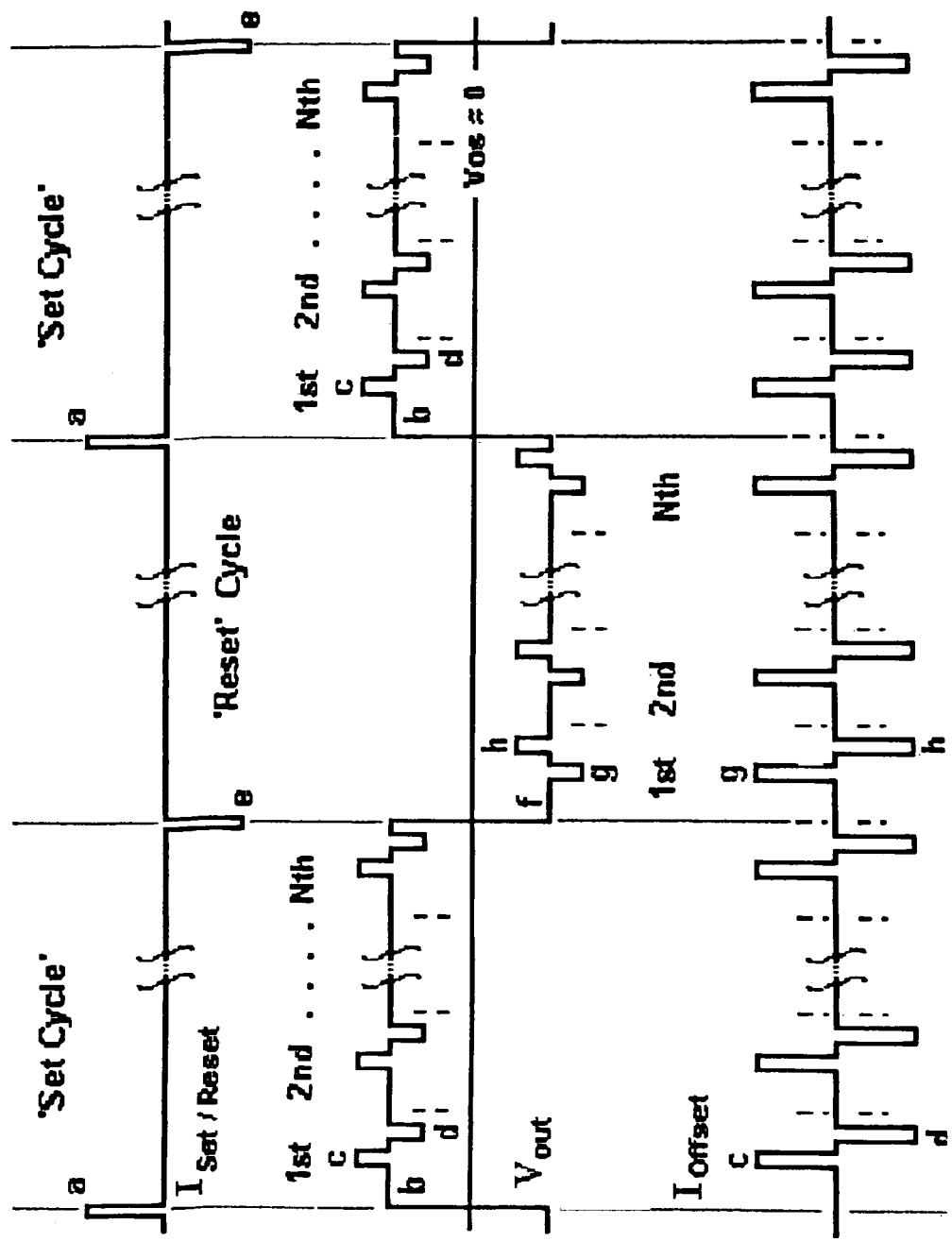
FIG. 2 illustrates one realization of a SET/RESET measurement cycle as utilized to normalize the output of an MR sensor in accordance with the technique of the present invention.

With reference additionally now to FIG. 2, one realization of a SET/RESET measurement cycle is shown as may be used to normalize the output of a MR sensor 10 (FIG. 1) in accordance with the technique of the present invention. Key timing events are labeled with lowercase letters "a" through "h" inclusive and substantially correspond to the similarly labeled paragraphs describing the activity described in greater detail hereinafter. It should be noted that different sampling schemes, including those having: a) different sampling orders and '$I_{OFST}$' values to determine differential gains; and/or b) different numbers of gain versus output samples per measurement block are also feasible and that the illustration shown is intended to be representative only.

It should be also noted that the '$V_{OUT}$' waveform depicted in FIG. 2 is consistent with an ambient field aligned parallel with the sensitive-axis field vector 22 of sensor 10, as shown in the preceding figure. Particularly illustrated for 'N'=1, as shown in FIG. 2, is that:

The SET/RESET pulse generator 24 delivers a positive-going current pulse to the SET/RESET strap (or coils 16A, 16B), which places the MR bridge 10 in the SET magnetic state.

After delaying for amplifier 34 settling time (which proceeds all A/D readings made after a change in magnetic state), the A/D converter 36 samples $V_{OUT}$ while the OFFSET strap (or coils 18A, 18B) current $I_{OFST}$ equals zero. This reading is defined as the SET magnetic output:

$Vmag\_set=CO+Cl[T]FH[H+0,Hca,+Ho]$

The OFFSET current generator 28 is turned on, augmenting the sensitive-axis 22 magnetic field by '+dH'. After a sufficient delay, the first of two A/D samples needed to find the SET gain is taken:

$Vgp\_set=CO+Cl[T]FH[H+dh,Hca,+Ho]$

The OFFSET strap current $I_{OFST}$ is reversed (current zeroing before reversal is not required), this time retarding the sensitive axis 22 field by 'dH'. The second A/D sample is then taken:

$Vgn\_set=CO+Cl[T]FH[H-dh,Hca,+Ho]$

The second sample is subtracted from the first to determine the SET gain:

$Vgain\_set=Vgp\_set-Vgn\_set=Cl[T]Gset[H,Hca,Ho,dH]$, where function $Gset[H,Hca,Ho,dH]=FH[H+dH,Hca,+Ho]-FH[H-dH,Hca,+Ho]$ is only dependent on magnetic parameters. Note that the subtraction also cancelled the 'CO' term.

The RESET measurement cycle (also illustrated in this figure) is similar to the SET cycle in that:

The SET/RESET strap 16 is now pulsed with a negative going current ISET, toggling the MR bridge 10 to the magnetic RESET condition.

Again with zero OFFSET strap current, the RESET magnetic output is sampled by the A/D converter 36:

$Vmag\_rset=CO+Cl[T]FH[H+O,Hca,-Ho]$

The OFFSET strap 18 is again energized to augment the sensitive axis field by '+dH', and the first of two A/D samples needed to find the RESET gain is made:

$Vgp\_rset=CO+Cl[T]FH[H+dH,Hca,-Ho]$ h) The OFFSET strap current $I_{OFST}$ is reversed, and the second A/D sample is taken:

$Vgn\_rset=CO+Cl[T]FH[H-dH,Hca,-Ho]$

The second sample is subtracted from the first to determine the RESET gain:

$Vgain\_rset=Vgp\_rset-Vgn\_rset=Cl[T]Grset[H,Hca,Ho,dH]$, where function $Grset[H,Hca,Ho,dH]=FH[H+dH,Hca,-Ho]-FH[H-dH,Hca,-Ho]$ is again only dependent on magnetic parameters.

After a SET and RESET measurement cycle pair has completed, the normalized (but unscaled) output for the sensitive axis 22 is defined by the following formula:

$$\text{Sensitive-Axis Output} \equiv Usen \equiv \frac{Vmag\_diff}{Vgain\_diff}$$
$$= \frac{Vmag\_set - Vmag\_rst}{Vgain\_set - Vgain\_rst}$$

The normalized (also unscaled) output for insensitive or cross-axis 20 is defined here as well:

$$\text{Cross-Axis Output} \equiv Ucrs \equiv \frac{Vgain\_sum}{Vgain\_diff}$$
$$= \frac{Vgain\_set + Vgain\_rst}{Vgain\_set - Vgain\_rst}$$

The denominator of both the sensitive-axis and cross-axis output terms is the difference between the SET and RESET gains:

$Vgain\_diff=Vgain\_set-Vgain\_rset=Cl[T]Gdiff[H,Hca,Ho,dH]$, where function $Gdiff[H,Hca,Ho,dH]\equiv Gset[H,Hca,Ho,dH]-Grset[H,Hca,Ho,dH]$ is only dependent on magnetic parameters.

The numerator of the cross-axis output term is the sum of the SET and RESET gains:

$Vgain\_sum=Vgain\_set+Vgain\_rset=Cl[T]Gsum[H,Hca,Ho,dH]$, where function $Gsum[H,Hca,Ho,dH]=Gset[H,Hca,Ho,dH]+Grset[H,Hca,Ho,dH]$ is only dependent on magnetic parameters.

The numerator of the sensitive-axis output term is the difference between the SET and RESET magnetic outputs:

$Vmag\_diff=Vmag\_set-Vmag\_rset=Cl[T]Mdiff[H,Hca,Ho,dH]$, where function $Mdiff[H,Hca,Ho,dH]=FH[H,Hca,+Ho]-FH[H,Hca,-Ho]$ is only dependent on magnetic parameters. Note again the cancellation of the 'CO' term.

The sensitive-axis output only depends on magnetic parameters 'Ho' and 'dH', as the temperature function, '$Cl[T]=Cl[(\Delta\rho/\rho)[T], \rho[T]]$', cancels from both numerator and denominator:

$$Usen = \frac{Cl[T] * Mdiff[H, \ldots, dH]}{Cl[T] * Gdiff[H, \ldots, dH]}$$
$$= \frac{Mdiff[H, Hca, Ho, dH]}{Gdiff[H, Hca, Ho, dH]}$$

Fixed scale-factors associated with 'Cl[T]' also cancel, making 'Usen' scale independent. Similar cancellations occur for the cross-axis expression:

$$Ucrs = \frac{Cl[T] * Gsum[H, \ldots, dH]}{Cl[T] * Gdiff[H, \ldots, dH]}$$

$$= \frac{Gsum[H, Hca, Ho, dH]}{Gdiff[H, Hca, Ho, dH]}$$

Specifically for the AN-205 application note 'Vout' approximation, the equations for the sensitive and cross-axis outputs are now derived:

Again, the magnetic form-factor approximation equals:

$FH[H,Hca,Ho] \cong (H/(Hca+Ho))$

The SET magnetic output equals:

$Vmag\_set=CO+Cl[T](H/(Hca+Ho))$, which is greater than $CO$ for $|Hca|<Ho$

The SET gain equals:

$Gset[H,Hca,Ho,dH]=FH[H+dH,Hca,+Ho]-FH[H-dH,Hca,+Ho]=(H+dH)/(Hca+Ho)-(H-dH)/(Hca+Ho)=(2dH)/(Hca+Ho)$, and $Vgain\_set=Cl[T]((2dH)/(Hca+Ho))$, {an always positive quantity for $|Hca|<Ho$}

The RESET magnetic output equals:

$Vmag\_rset=CO+Cl[T](-H/(Ho-Hca))$, (which is less than $CO$ for $|Hca|<Ho$)

The RESET gain equals:

$Grset[H,Hca,Ho,dH]=FH[H+dH,Hca,-Ho]-FH[H-dH,Hca,-Ho]=(H+dH)/(Hca-Ho)-(H-dH)/(Hca-Ho)=(-2dH)/(Ho-Hca)$, and $Vgain\_rset=Cl[T]*(-2dH)/(Ho-Hca)$, (an always negative quantity for $|Hca|<Ho$)

The SET gain–RESET gain difference equals:

$Gdiff[H,Hca,Ho,dH]=Gset[H,Hca,Ho,dH]-Grset[H,Hca,Ho,dH]=(2dH)/(Hca+Ho)+(2dH)/(Ho-Hca)=(4Ho\ dH)/(Ho^2-Hca^2)$, and $Vgain\_diff=Cl[T]*((4Ho\ dH)/(Ho^2-Hca^2))$ The SET gain+RESET gain sum equals:

$Gsum[H,Hca,Ho,dH]=Gset[H,Hca,Ho,dH]+Grset[H,Hca,Ho,dH]=(2dH)/(Hca+Ho)-(2dH)/(Ho-Hca)=(-4dH\ Hca)/(Ho^2-Hca^2)$, and $Vgain\_sum=Cl[T]*((-4dH\ Hca)/(Ho^2-Hca^2))$ The SET magnetic output–RESET magnetic output equals:

$Mdiff[H,Hca,Ho,dH]=FH[H,Hca,+Ho]-FH[H,Hca,-Ho]=((H/(Hca+Ho))-(H/(Hca-Ho))=(2Ho\ H)/(Ho^2-Hca^2)$, and $Vmag\_diff=Cl[T]*((2Ho\ H)/(Ho^2-Hca^2))$ The sensitive-axis output, 'Usen' is seen to be proportional only to 'H', as the '$Ho/(Ho^2-Hca^2)$' term common to both numerator and denominator cancel:

$$Usen = \frac{Mdiff[H, \ldots, dH]}{Gdiff[H, \ldots, dH]}$$

$$= \frac{(2 \cdot Ho \cdot H)/(Ho^2 - Hca^2)}{(4 \cdot Ho \cdot dH)/(Ho^2 - Hca^2)} = \frac{H}{(2*dH)}$$

As the constant of proportionality, '1/(2 dH)', contains no 'Ho' terms, 'Usen' is also independent of magnetic parameter temperature dependencies. Given that OFFSET strap geometry is fixed, the precision of 'dH' is determined directly by 'Iofst'.

The cross-axis output, 'Ucrs' is seen to be proportional only to 'Hca', as the '$Ho/(Ho^2-Hca^2)$' term common to both numerator and denominator cancel. Given that constant of proportionality equals '-(1/Ho)', the temperature dependency of 'Ucrs' should be equal to or less than the temperature variation of the anisotropy field, 'Hk':

$$Ucrs = \frac{Gsum[H, \ldots, dH]}{Gdiff[H, \ldots, dH]}$$

$$= \frac{(-4 \cdot dH \cdot Hca)/(Ho^2 - Hca^2)}{(4 \cdot Ho \cdot dH)/(Ho^2 - Hca^2)} = \frac{Hca}{(-Ho)}$$

All equations can be generalized to multiple samples by replacing individual quantities with the appropriate averages. Also, the number of gain samples per SET/RESET cycle need not equal the number of magnetic output samples. Let the magnetic output samples per SET/RESET cycle (steps (b) and (f)) be repeated 'N' times, the number of gains taken per SET/RESET cycle (steps (c)–(d) and steps (g)–(h)) be repeated 'M' times (FIG. 2 is drawn for 'M'='N'). The numbers of samples 'N' and 'M' taken per SET or RESET cycle, as well as the sampling rate, are implementation specific and dependent on the microprocessor speed of the microprocessor control block 32 and signal filtering requirements.

The averaged sensitive-axis output equation has a new scaling constant that manifests when 'N'≠'M':

$$Usen \cong \left(\frac{N}{M}\right) \cdot \frac{H}{(2 \cdot dH)}$$

$$\cong \frac{\sum_1^N (\text{Set Outputs}) - \sum_1^N (\text{Reset Outputs})}{\sum_1^M (\text{Set Gains}) - \sum_1^M (\text{Reset Gains})}$$

The averaged cross-axis equation has no additional scaling constant because the 'M' terms common to both numerator and denominator cancel:

$$Ucrs \cong \frac{Hca}{(-Ho)} \cong \frac{\sum (\text{Set Gains}) + \sum (\text{Reset Gains})}{\sum (\text{Set Gains}) - \sum (\text{Reset Gains})}$$

Scaled sensitive and cross-axis equations are found by multiplying by the appropriate constants of proportionality:

$Hsen \cong (M/N)(2dH)Usen$, and $Hcrs \cong (-Ho)Ucrs$

The sensitive/cross-axis output streams are updated as subsequent SET/RESET blocks become available.

Figure 7:
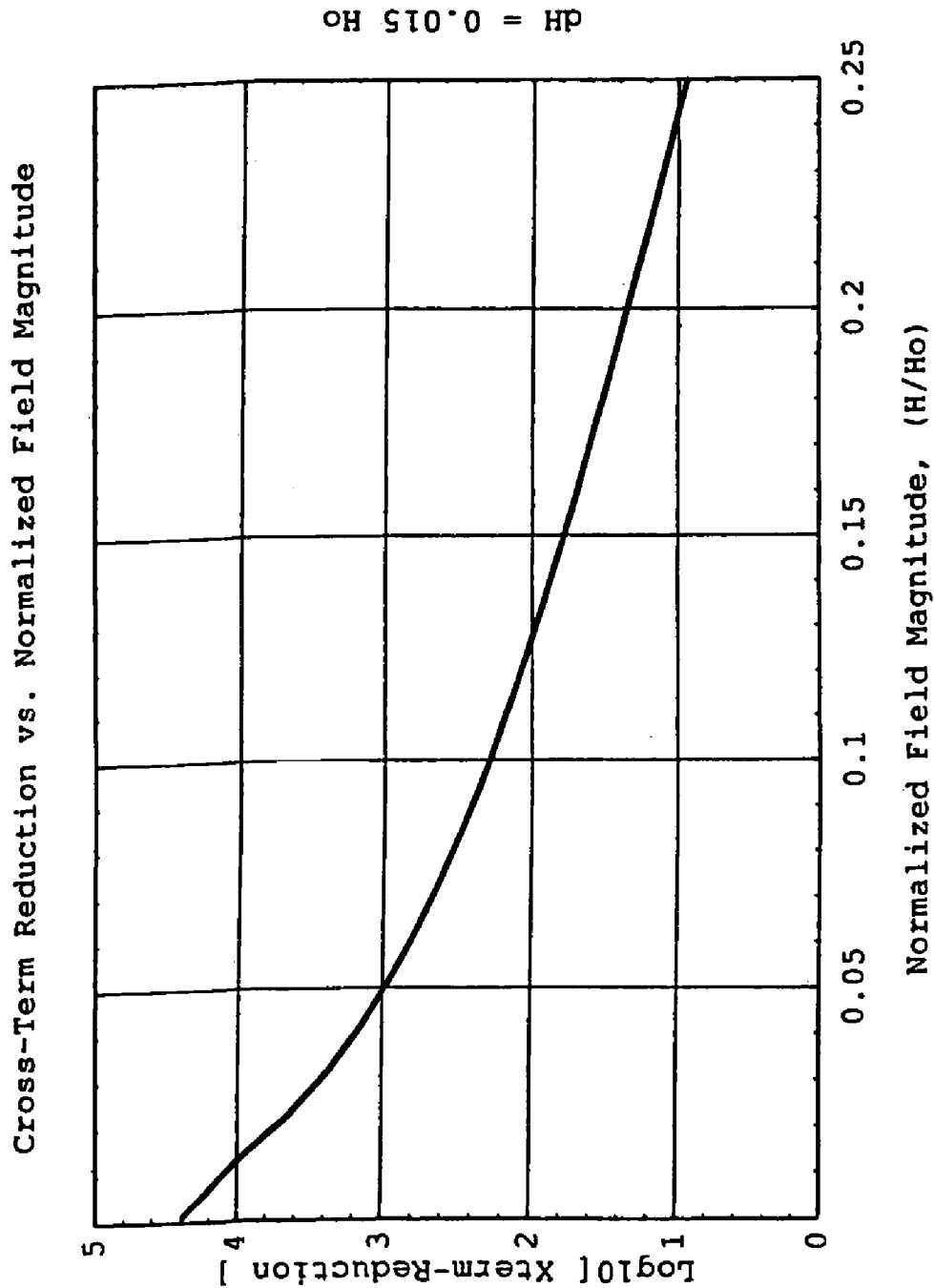
FIG. 7 illustrates the expected cross-term reduction, due to implementation of the techniques of the present invention, for a representative sensor with the plot being semi-logarithmic and with the independent axis being the normalized sensitive-axis field (H/Ho)

With reference additionally now to FIG. 7, the expected cross-term reduction, which result from implementation of the techniques of the present invention, is plotted against the normalized sensitive-axis field, (H/Ho). The plot was generated via numerical simulation using constants for a representative sensor ('Ho'=8 Gauss, maximum field range=2 Gauss, and 'dH'=0.12 Gauss). Note that for (H/Ho)<0.075 (small fields), the amount cross-term reduction begins to peak as (H/Ho) approaches zero, which is illustrative of the influence of 'dH'. For larger fields, the amount of cross-term reduction decreases in an approximately logarithmic manner.

Finally, since 'dH' and 'Ho' are constants of proportionality, they can be found directly if the sensitive and cross-axis fields are known. A simple calibration to determine these constants will be discussed, and once known, 'dH' and 'Ho' then can be used to calibrate the reported field values to specific units and be available for utilization in correcting for higher-order non-linearities.

To illustrate a representative linearization, the scaled sensitive-axis output, 'Hsen', is first constructed using the 'dH' determined from calibration.

$$Hsen \cong H \cong \left(\frac{M}{N} \cdot (2 \cdot dH)\right) \cdot \frac{\sum_{1}^{N}(\text{Set Outputs}) - \sum_{1}^{N}(\text{Reset Outputs})}{\sum_{1}^{M}(\text{Set Gains}) - \sum_{1}^{M}(\text{Reset Gains})}$$

Next, as will be shown hereinafter in greater detail, 'Hsen' is generally processed through a simple function of itself and a calibrated value for 'Ho' to accomplish a significant linearization of 'Hsen':

$$H_{Calibrated} \cong Hsen - (1/Ho^2) \cdot (Hsen^3)$$

Figure 8:
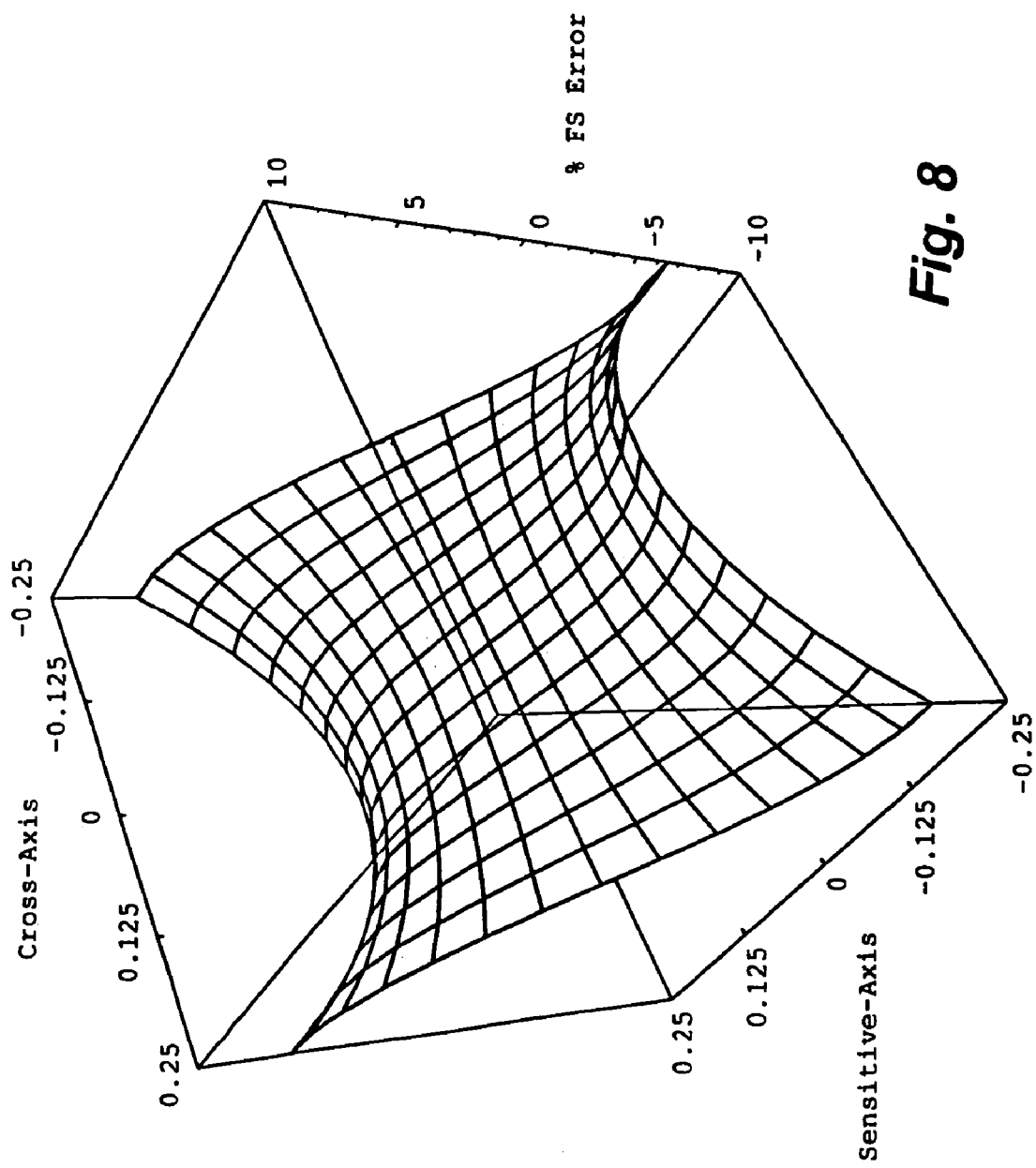
FIG. 8 shows a three-dimensional plot illustrating the percentage of full-scale error, as compared to the normalized true sensitive-axis field for a SET-RESET magnetic output calibrated to a full-scale field of '0.25 Ho' and wherein the plot range also covers this full-scale field value for both the sensitive and cross-axes.
Figure 9:
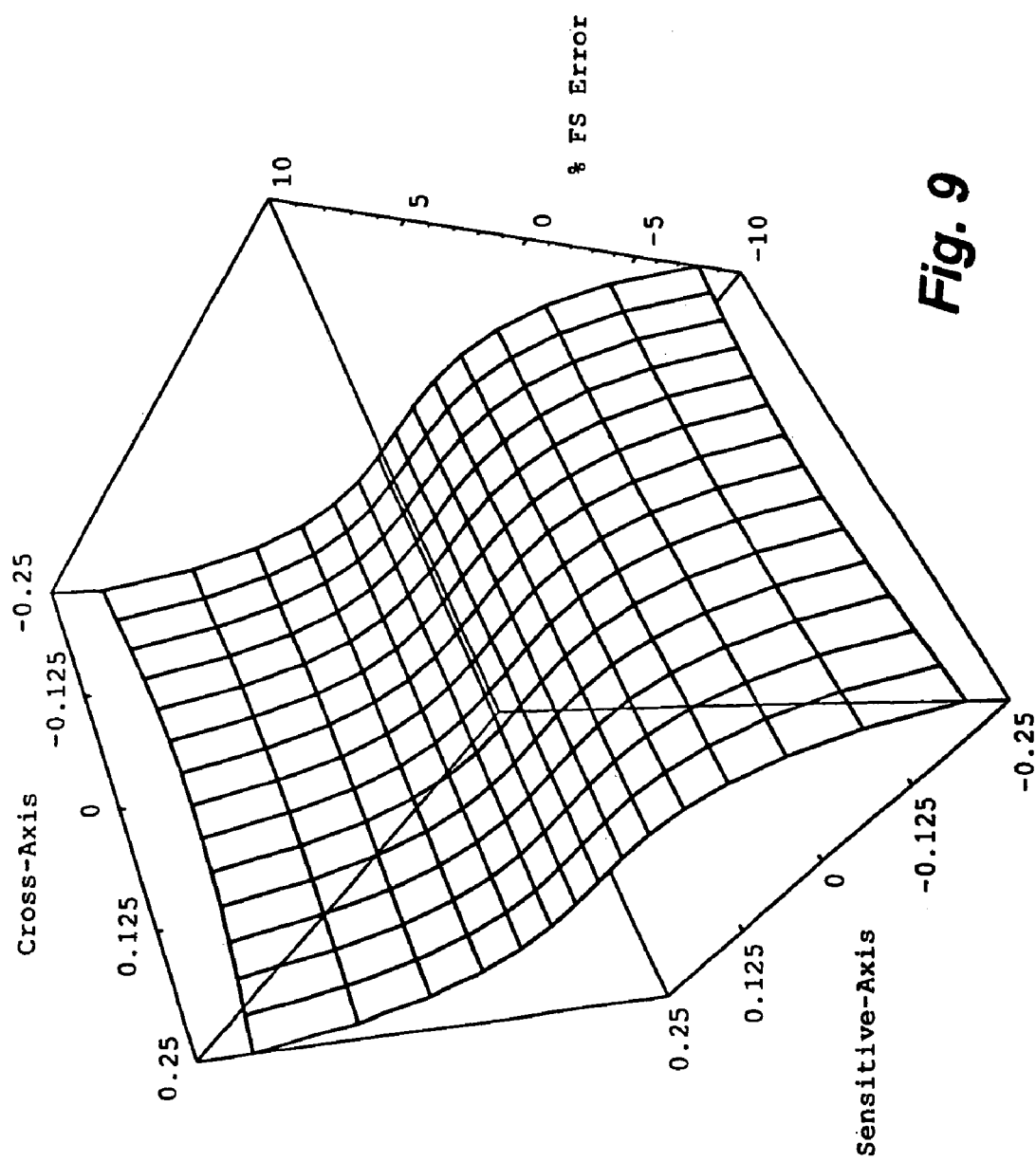
FIG. 9 shows a three-dimensional plot illustrating the percentage error for 'scaled' sensitive-axis output created using the techniques of the present invention and wherein the plot range and error scaling is as in the preceding figure.
Figure 10:
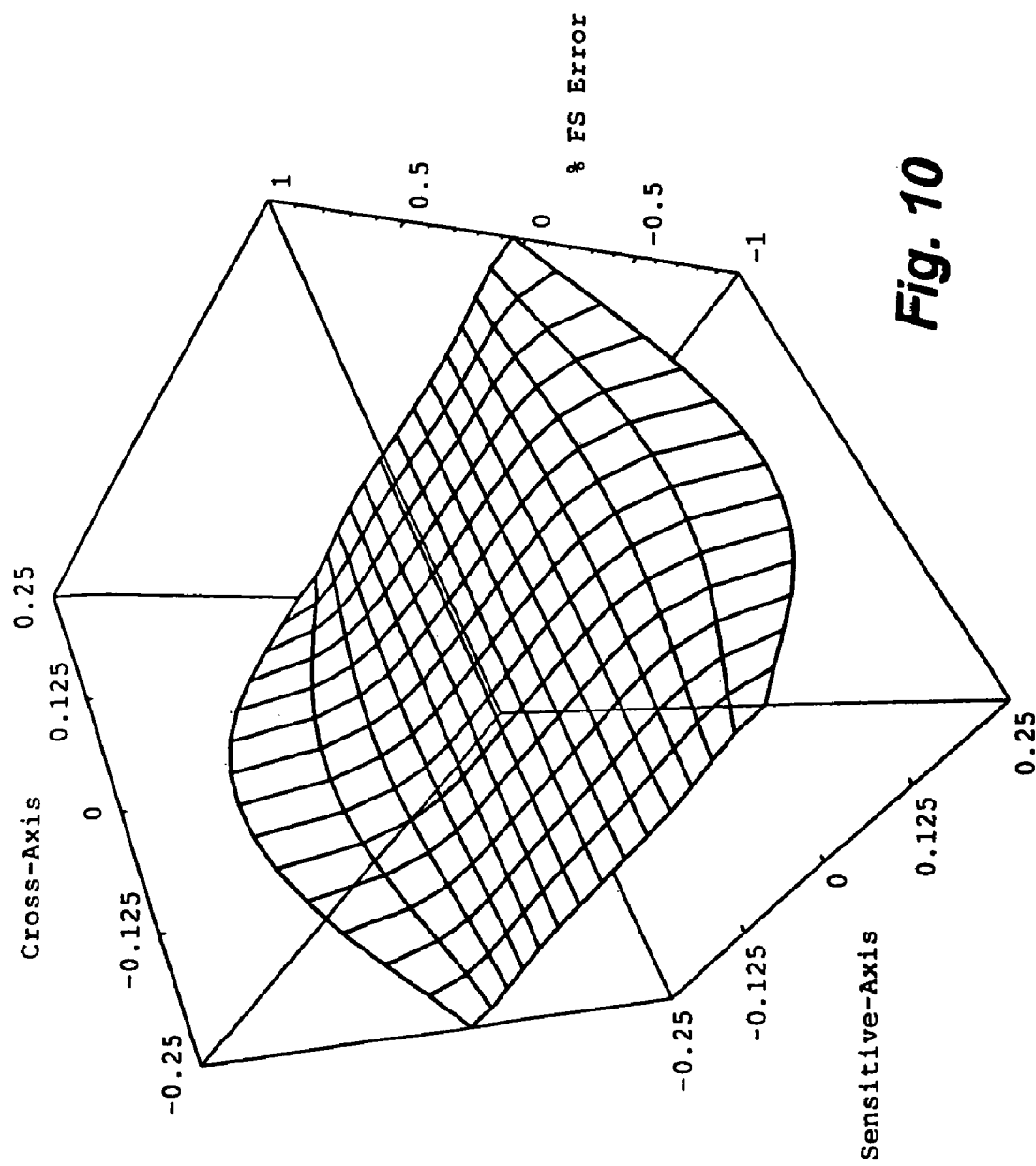
FIG. 10 show a three-dimensional plot illustrating the percentage of full-scale error, as compared to the normalized true sensitive-axis field, for the 'scaled' and 'linearized' sensitive-axis output created using the techniques of the present invention and wherein the plot range is as in the preceding two figures.

Now with particular reference additionally to FIGS. 8, 9, and 10, each of these figures shows a three-dimensional plot showing the percentage of full-scale error, as compared to the true sensitive-axis field, for a specific sensitive-axis output:

$$\% \ FS \ \text{Error} = 100 \cdot \frac{(\text{Outputs}/Ho) - (H_{True}/Ho)}{(H_{FullScale}/Ho)}$$

All field values are normalized to the MR sensor constant, 'Ho', to allow for generalized comparisons between sensors. Both the sensitive and cross-axis ranges, as well as the error normalization constant, have been set to a representative maximum (full-scale) field value of '0.25 Ho'.

With specific reference to FIG. 8, the percentage error of the SET-RESET magnetic output, 'calibrated' also to a (H/Ho) value of 0.25, is shown. Note this error varies significantly with both sensitive and cross-axis field.

With particular reference to FIG. 9, the. percentage error of the scaled sensitive-axis output, 'Hsen' is shown. Note that error variation with cross-axis field has been greatly reduced, while the sensitive-axis error has been redistributed towards the larger field values, as compared to the previous figure.

With particular reference to FIG. 10, the percentage error of a 'scaled' and 'linearized' sensitive-axis output is illustrated. Here the error variation;

Has been reduced by an order of magnitude, as compared to FIG. 9, for the sensitive-axis field extremes; and Diminishes rapidly towards zero as both the sensitive and cross-axis fields, magnitudes are reduced.

The actual error variation depends mainly on how accurately 'dH' can be determined, and to a lesser degree, 'Ho'.

The following is an overview of a SET/RESET output normalization technique in accordance with the present invention as implemented in a particular embodiment.

Figure 3:
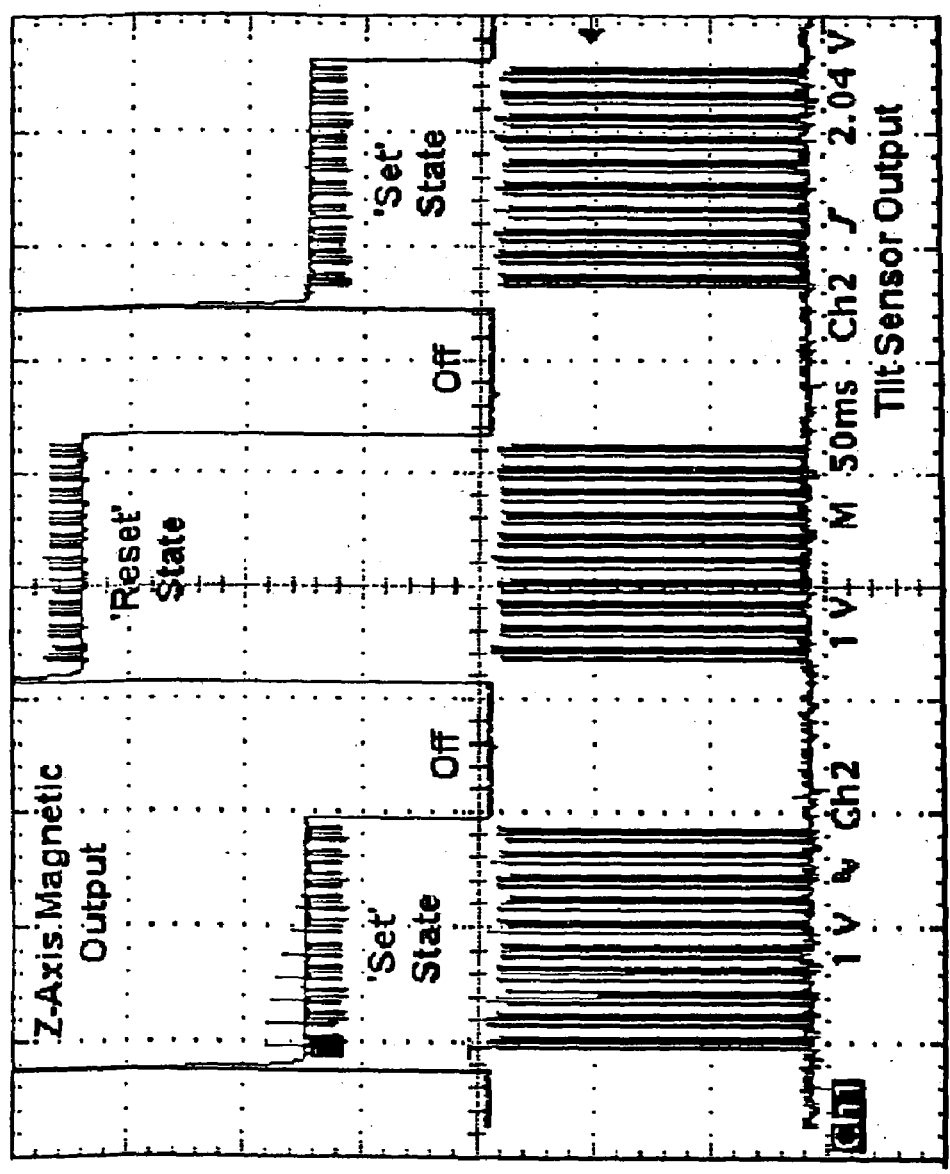
FIG. 3 illustrates a SET/RESET measurement cycle in accordance with the present invention as may be utilized, for example, in a specific implementation of a Mapstar™ II compass available from Laser Technology, Inc., assignee of the present invention.

With reference additionally now to FIG. 3, a SET/RESET measurement cycle as may be used in conjunction with an exemplary implementation of the techniques of the present invention is shown, as utilized in the Mapstar™ II compass available from Laser Technology, Inc, assignee of the present invention. In each 0.1-sec SET or RESET measurement block, the following analog/digital (A/D) measurements are made:

40 X,Y, and Z magnetic output samples, (3×40)=120 A/D samples; 'N'=40);

b) 10 X,Y, and Z magnetic (+/−) gain measurements (3×2×10)=60 A/D samples; 'M'=10); and 10 pitch/roll channel measurements (2×2×10=40 A/D measurements).

For economy of hardware, the X, Y, and Z MR, chips share both a single SET/RESET and single OFFSET pulse generator. As a result of these shared generators;

The SET/RESET cycles for all sensors are synchronous; and

The SET or RESET gain queries made for a given MR sensor show up simultaneously on the output of all the sensors. Hence it should be noted that the waveform timing for one MR channel is representative for all others.

It should be noted that the sampling intervals and relative ratio of output-to-gain samples utilized were not determined by the technique of the present invention itself, but were selected in light of the sampling rate required to reject 50/60 Hz magnetic interference and the speed of the particular microprocessor used in the hardware implementation of the Mapstar™ II compass.

Figure 4:
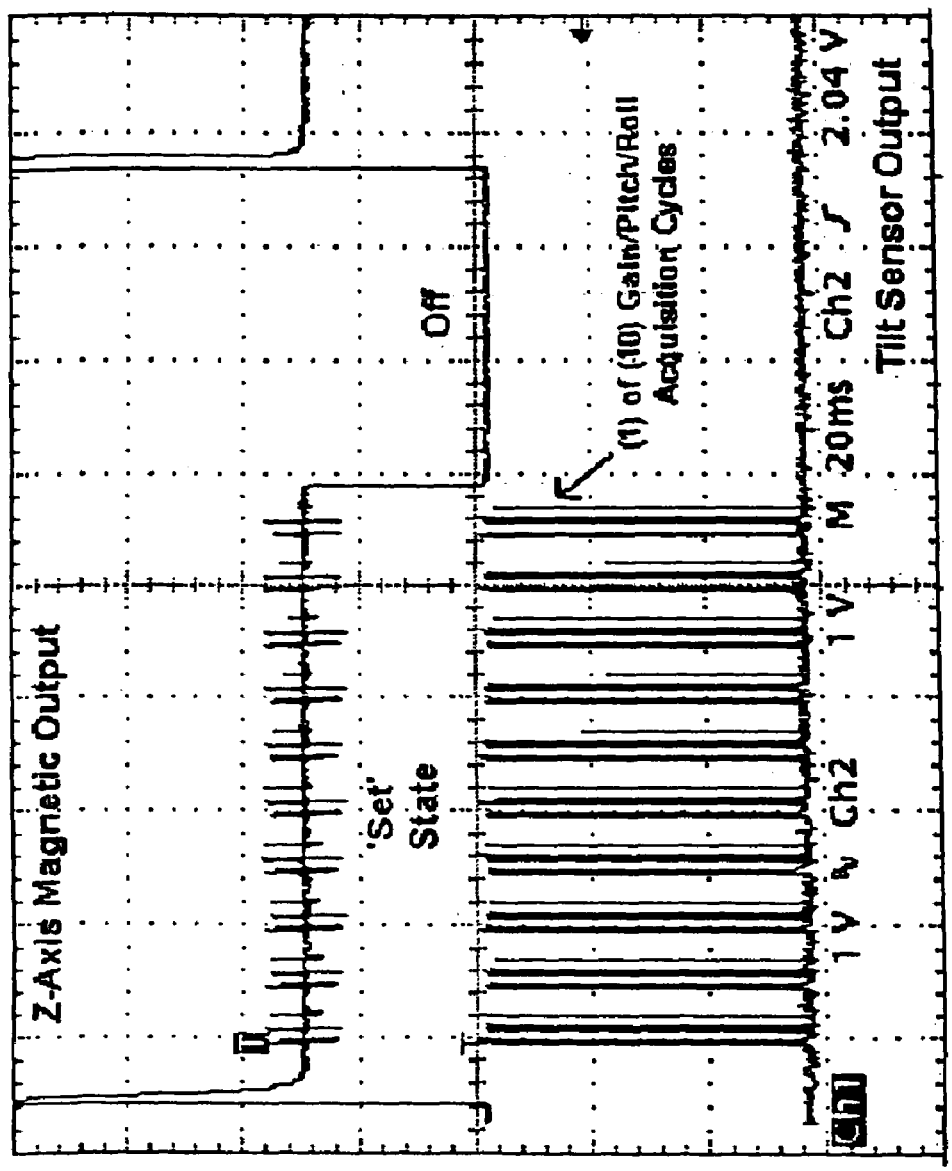
FIG. 4 is an expanded view of the SET portion of the measurement cycle illustrated in the preceding figure.
Figure 5:
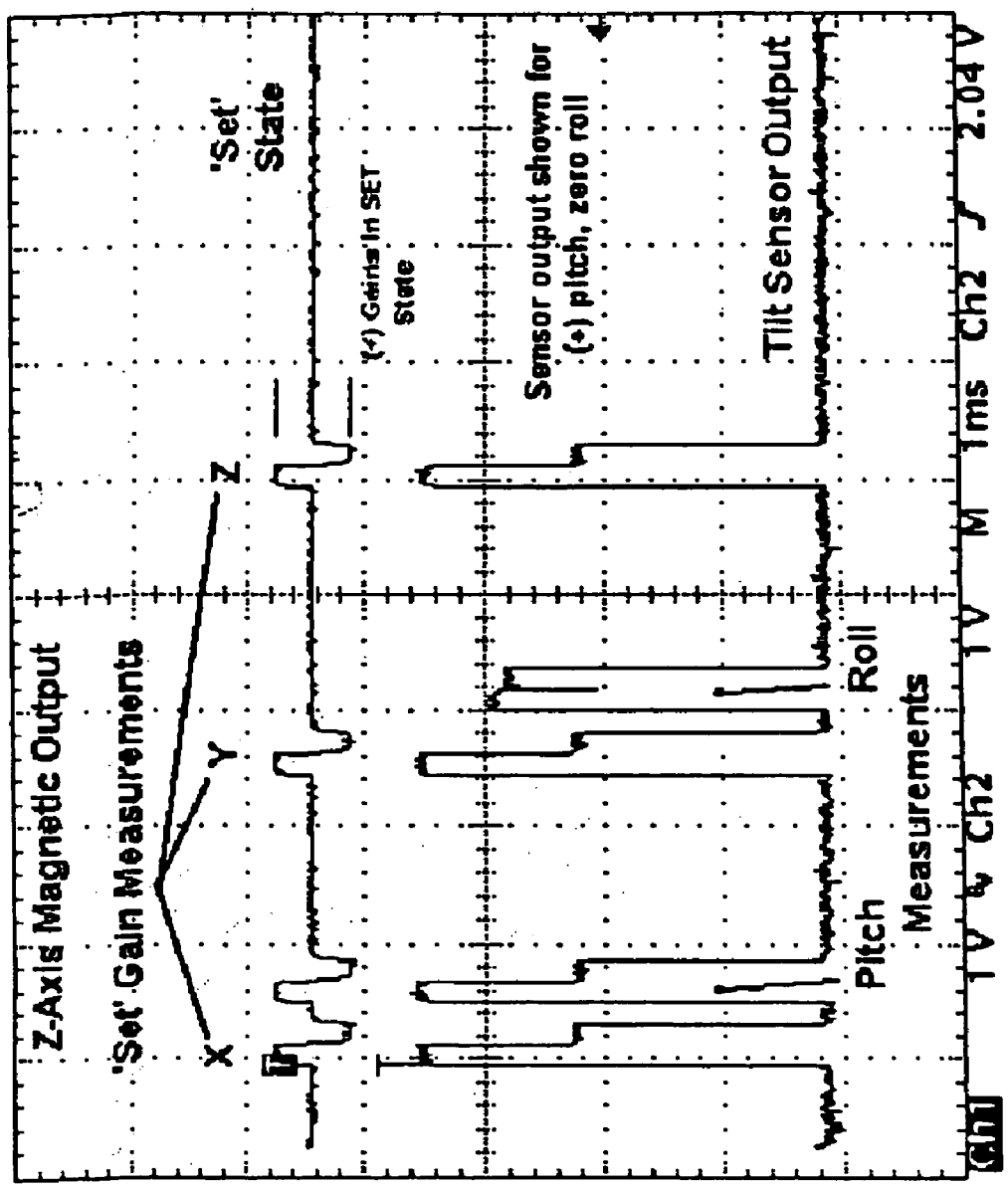
FIG. 5 illustrates one of the ten gain/pitch/roll acquisition sequences made in the SET magnetic state and indicates that the first sample of the X, Y or Z channel gain measurement is positive with respect to baseline while the second is negative.

With reference additionally now to FIGS. 4 and 5, an expanded view of the SET portion of the measurement cycle shown in the preceding figure is illustrated in the former figure while one of the ten Gain/Pitch/Roll acquisition sequences made in the SET magnetic state is shown in the latter. It should be noted that for the SET magnetic state, the first sample of a X, Y, or Z channel gain measurement is positive with respect to baseline (which represents the ambient magnetic field), while the second is negative. The positive difference between these two gain readings constitute a SET gain measurement.

Figure 6:
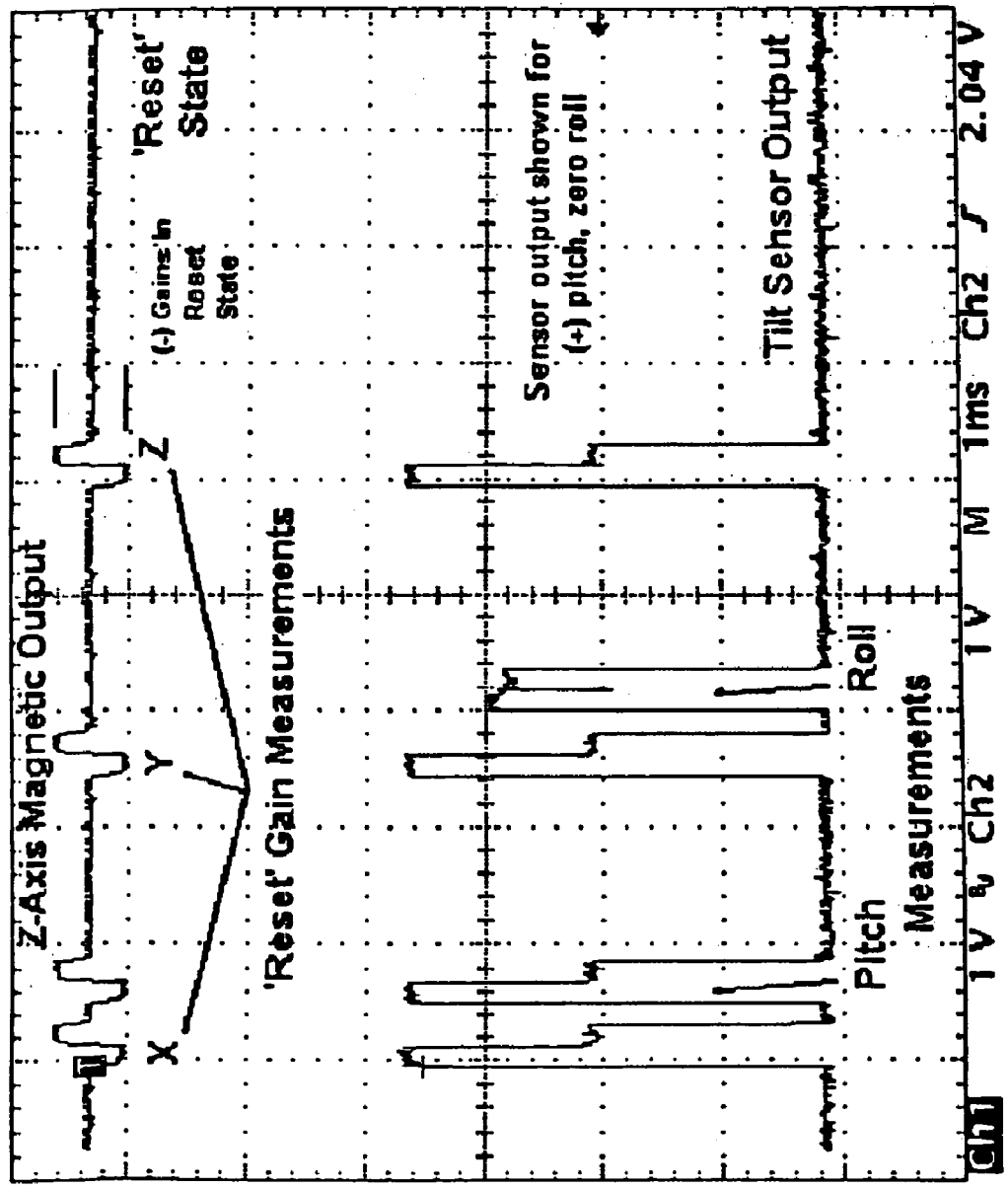
FIG. 6 illustrates one of the ten gain/pitch/roll acquisition sequences made in the RESET magnetic state and indicates that the first sample of the X, Y or Z channel gain measurement is instead negative with respect to baseline while the second is positive.

With reference additionally now to FIG. 6, the converse is true for the RESET gain measurement illustrated. The first sample of an X, Y, or Z channel gain measurement is negative with respect to baseline, while the second is positive, which results in-a negative RESET gain measurement. The plus/minus gain polarity for the SET/RESET gains is due both to how the MR sensor 10 functions and the way the OFFSET strap 18 is energized during the measurements.

After block measurements for both the SET and RESET magnetic states are made, a normalized output, in which both temperature and magnetic cross-term effects are greatly reduced, can be calculated using the following formula:

$$Usen \cong \left(\frac{40}{10}\right)\frac{H}{(2 \cdot dH)} \cong \frac{\sum_{1}^{40}(\text{Set Outputs}) - \sum_{1}^{40}(\text{Reset Outputs})}{\sum_{1}^{10}(\text{Set Gains}) - \sum_{1}^{10}(\text{Reset Gains})}$$

The normalized output stream is updated as subsequent SET/RESET blocks become available.

With particular reference to pages 11, 12 and 15–19 of the Philips Publication (Appendix 1: The Magnetoresistive Effect) the "barber-pole" sensor equations can be developed. Equation (1) on page 15 defines the resistivity-field relationship as a function of the angle 'Θ' between the internal magnetization vector 'M' and current vector 'I', with '$\rho\perp$' and '$\rho\|$' being the resistivities respectively perpendicular and parallel to the magnetization vector 'M':

$$\rho[\Theta] = \rho_\perp + (\rho_\perp - \rho_\|)\text{Cos}^2[\Theta]$$

From FIG. 17 on page 15, Θ can be expressed as the sum of (2) angles, $\Theta = \phi + \theta$, where 'φ' is the angle between vector M and the length-axis (+x axis), and 'θ' is the angle between vector I and the length-axis. Note that φ varies as vector M rotates under the influence of external fields, while vector I (hence θ) is fixed for a given sensor type.

The quotient, '$Q = (\Delta\rho/\rho) = (\rho_\perp - \rho_\|)/\rho\perp$', is defined as the anisotropic magnetoresistive constant, and equation (1) can be modified to show this constant:

$$\rho[\Theta] = \rho_\perp(1 + Q\text{Cos}^2[\Theta])$$

For the simple geometry for the resistor shown in FIG. 17, the resistance-field equation is:

$$R[\Theta] = (LW/t)\rho[\Theta] = Ro(1 + Q\text{Cos}^2[\Theta]),$$

where thickness 't' is much smaller than width 'W', which in turn is smaller than length 'L'. The quantity '$Ro = \rho_\perp(LW/t)$' is the equivalent resistance for a non-magnetoresistive, i.e., 'ordinary' resistor with similar geometry.

Following the discussions of pages 11, 12, and 17, the equations describing a 'barber-pole' MR bridge are derived here. First, the resistance equation is scaled by a scale factor 'α' to account for the resistance reduction due to the shorting strips:

$$R[\Theta] = (\alpha Ro)(1 + Q\text{Cos}^2[\Theta])$$

The 'α Ro' term has the same physical interpretation as the original Ro, and equals the resistance value for an 'ordinary' resistor with shorting strips. Henceforth for brevity, the 'α' term will be dropped in subsequent equations.

It is now helpful to model the change in current direction caused by the addition of 'barber-pole' shorting strips. To do this, the rotation angle θ for current vector 'I' must be set to $\pm\pi/4$. Define 'Rn' to be a magnetoresistor whose value decreases with applied sensitive-axis field. For this case, $\theta = +\pi/4$:

$$Rn = Ro(1 + Q\text{Cos}^2[+\pi/4 + \phi])$$

'Rp' can be defined to be a magnetoresistor whose value increases with an applied sensitive-axis field. For this case, $\theta = -\pi/4$:

$$Rp = Ro(1 + Q\text{Cos}^2[-\pi/4 + \phi])$$

Expanding the $\text{Cos}^2[\ ]$ terms in both the 'Rn' and 'Rp' equations reveals the magnetic form-factor, '$\text{Cos}[\phi]\text{Sin}[\phi]$', which only depends on applied fields:

$$Rn = Ro(1 + Q/2 - Q\text{Cos}[\phi]\text{Sin}[\phi]) = Ro(1 + Q/2 - Q\,FH[\phi])$$

$$Rp = Ro(1 + Q/2 + Q\text{Cos}[\phi]\text{Sin}[\phi]) = Ro(1 + Q/2 + Q\,FH[\phi])$$

Re-distributing terms shows that the 'barber-pole' resistors can be modeled by the sum and/or difference of two resistors:

$$Rn = (Ro)(1 + Q/2) - (Ro)(Q)FH[\phi] = Ra[T] - Rb[T]FH[\phi]$$
$$= Rt[T] - Rm[\phi, T], \text{ and}$$

$$Rp = (Ro)(1 + Q/2) + (Ro)(Q)FH[\phi] = Ra[T] + Rb[T]FH[\phi]$$
$$= Rt[T] + Rm[\phi, T], \text{ where}$$

'Rm' varies magnetically, and 'Rt' does not.

These resistance expressions then can be substituted into circuit topologies to derive equations reflecting various bridge-sensor/amplifier combinations. For a constant-voltage bridge, Vout is simply the difference between the (+) and (−) voltage-divider legs of the bridge. Expressing Vout in terms of Rm and Rt:

$$Vout = Vbr \cdot \frac{Rp - Rn}{Rp + Rn}$$
$$= Vbr \cdot \frac{(Rt + Rm) - (Rt - Rm)}{(Rt + Rm) + (Rt - Rm)}$$
$$= Vbr \cdot \frac{Rm[\varphi, T]}{Rt[T]}$$
$$= Vbr \cdot \left(\frac{Rb[T]}{Ra[T]}\right) \cdot FH[\varphi]$$

Vout for a constant-current bridge is relatively easy to derive by noting that sum (Rp+Rn) is a constant for any applied field, hence $Vbr = I(Rp+Rn)/2$:

$$Vout = Vbr \cdot \frac{Rp - Rn}{Rp + Rn}$$
$$= \left(I \cdot \frac{(Rp + Rn)}{2}\right) \cdot \frac{(2 \cdot Rm)}{(Rp + Rn)}$$
$$= I \cdot Rm[\varphi, T]$$
$$= I \cdot Rb[T] \cdot FH[\varphi]$$

Note that the mathematical form for Vout in both MR bridge expressions is a product of (2) functions, one being of temperature, and the other being simply the magnetic form-factor of the 'barber-pole' magnetoresistors. The temperature function derives from the temperature dependencies of Ro and/or Q:

$$Vout = (Vbr(2Q/(2+Q)))FH[\phi] \text{ for the 'V' bridge}$$

$$Vout = (I\,Ro\,Q)\,FH[\phi] \text{ for the 'I' bridge}$$

The $V_{OUT}$ expressions for both the constant-voltage and constant-current bridges can be generalized again into the form:

$$V_{OUT} = CO + Cl[T]FH[\phi[Hx, Hy]],$$

where 'CO' is considered a constant, Cl[T] is some function of temperature, and $FH[\phi[Hx,Hy]]$ is a reasonable approximation for the 'barber-pole' MR resistor magnetic form-factor. For the cases of the constant-voltage and constant-current bridges, 'CO' represents the zero-field bridge offset voltage, which is caused by resistance mismatches occurring during fabrication.

Other circuit topologies whose output can approximate the 'C0+Cl FH' form can be used with the techniques of the present invention. The Mapstar™ II compass uses a constant-voltage MR bridge coupled with a single operational-amplifier approximation for a true differential bridge amplifier; the Rt/Rm form for the Vout equation looks like:

$$Vout = \frac{Vbr}{2} + Vbr \cdot \left[\frac{1}{2} + \frac{2 \cdot Rf}{Rt + 2 \cdot Rg - Rm^2/Rt}\right] \cdot \frac{Rm}{Rt}$$

Zeroing the tiny '$Rm^2/Rt$' term (because Rt>>Rm, hence Rt>>$Rm^2/Rt$ as well) results in an approximation with the desired 'C0+Cl FH' form:

$$Vout \approx \frac{Vbr}{2} + Vbr \cdot \left[\frac{1}{2} + \frac{2 \cdot Rf}{Rt + 2 \cdot Rg}\right] \cdot \left(\frac{Rb[T]}{Ra[T]}\right) \cdot FH[\varphi]$$

$$\approx C0 + Cl[T] \cdot FH[\varphi]$$

In order to complete the MR resistor/bridge equations, the magnetic form-factor needs to be expressed in terms of both the sensitive ('Hx') and cross-axis ('Hy') fields instead of '$\phi$':

$FH[\phi[Hx,Hy]]=NewFH[Hx,Hy]$

This equation defines $\phi[Hx,Hy]$ in terms of a transcendental equation:

$Sin[\phi]=Hy/(Ho+(Hx/Cos[\phi]))$

Because of the transcendental nature of $\phi[Hx,Hy]$, only approximations for $FH[Hx,Hy]$, and ultimately, any type of 'barber-pole' MR sensor, can be defined. This equation, however, can be solved numerically, which allows for the comparison of various form-factor approximations as well as numerical simulations of magnetoresistive sensor/amplifier topologies.

The simplest approximation for $FH[Hx,Hy]$ and the one used for the 'Vout' expression given in the AN-205 application note reference, assumes that '$\phi$' is small enough such that that $Cos[\phi]\cong1$, in both '$FH[\phi]$' and equation (6) therein states:

$FH[\phi]=Cos[\phi]Sin[\phi]\cong(1)Sin[\phi]$, and $Sin[\phi]\cong Hx/(Ho+Hy/(1))$, which leads to $FH[Hx,Hy]\cong Hx/(Hy+Ho)$, or $FH[H,Hcal]\cong H/(Hca+Hs)$ (as denominated in AN-205)

'Vout' for the constant-voltage bridge becomes:

$Vout=(Vbr(2Q/(2+Q)))FH[\phi]$ $a(H/(Hca+Hs))$, which assumes $a \cong (Vbr\ Q)$, which is a good approximation since if Q<<2, 'Vout' for the constant-current bridge is:

$Vout=(I\ Ro\ Q)FH[\phi]$ $a(H/(Hca+Hs))$, where $a \cong (I\ Ro\ Q)$

Note that these equations derived for the constant voltage and current MR bridge types matches the 'Vout' equation given in the AN-205 application note reference.

Although the AN-205 'Vout' approximation is suitable for most applications, experimental evidence to be shown hereinafter indicates refinements are needed to model the finer features a MR bridge sensor. Specifically, actual SET-RESET gain differences show quadratic-like variations for BOTH the sensitive and cross-axis fields, but the AN-205 approximation predicts NO variation with the sensitive-axis field:

$Vgain\_diff=Cl[T]*((4Ho\ dH)/(Ho^2-Hy^2))$ has no 'Hx', the sensitive-axis field term.

To derive a second approximation for $FH[\phi[Hx,Hy]]$, assume that that $Cos[\phi]\cong1$ only for equation (6), but not for $FH[\phi]$. Given that $Sin[\phi[Hx,Hy]]\cong Hx/(Ho+Hy)$, $Cos[\phi]=Sqrt[1-Sin^2[\phi]]$, and $FH[\phi]=Sin[\phi]Cos[\phi]$, the second 'FH' approximation equals:

$$FH[Hx, Hy, Ho] \cong \left(\frac{Hx}{Hy+Ho}\right) \cdot Sqrt\left[1-\left(\frac{Hx}{Hy+Ho}\right)^2\right]$$

Comparing both the AN-205 and second form-factor approximations via a reference numerical solution indicates the second approximation reduces the maximum approximation error (0.30% versus 0.026%) by about one order of magnitude for a sensitive/cross-axis field range of ±0.6 Gauss with Ho=8 Gauss.

To verify this second approximation, the SET gain-RESET gain (a composite of several functions) using this form-factor was determined:

$Vgain\_diff \cong Cl[T]Gdiff[Hx,Hy,Ho,dH]$, where function $Gdiff[Hx,Hy,Ho,dH] \cong Gset[Hx,Hy,Ho,dH]-Grset[Hx,Hy,Ho,dH]$, and $Gset[Hx,Hy,Ho,dH] \cong FH[Hx+dH,Hy,+Ho]-FH[Hx-dH,Hy,+Ho]$ $Grset[Hx,Hy,Ho,dH] \cong FH[Hx+dH,Hy,-Ho]-FH,[Hx-dH,Hy,-Ho]$ For comparison purposes, 'Vgain_Diff' needs to be normalized with respect to amplifier and A/D scale factors; this is done by dividing 'Vgain_diff' with its zero-field value:

Normalized $Vgain\_diff=Gdiff[H,Hca,Ho,dH]/Gdiff[0,0,Ho,dH]$

As this normalized 'Vgain_diff' expression is fairly involved, it will not be reproduced herein. A second-order series expansion, however, is useful in illustrating how the normalized SET-RESET gain behaves while Hx and Hy vary individually:

For Hy=0 and dH→0, the series expansion indicates that the normalized SET-RESET gain decreases quadratically with the sensitive-axis field, 'Hx':

Normalized $Vgain\_diff \cong 1+(-2/3)Ho^2)^{-1}Hx^2$ ii) For Hx=0 and dH→0, the series expansion indicates that the normalized SET–RESET gain increases quadratically with the cross-axis field, 'Hy':

Normalized $Vgain\_diff \cong 1+(Ho^2)^{-1}Hy^2$

As both these behaviors are consistent with both experimental data and numerical simulation, it is concluded the second approximation is adequate for further symbolic work.

To determine the amount of cross-term reduction afforded by the techniques of the present invention, both 'calibrated' SET–RESET magnetic outputs and sensitive-axis outputs are required. The SET-RESET magnetic output equals:

$Vmag\_diff = Vmag\_set - Vmag\_rset = Cl[T]Mdiff[H, Hca, Ho, dH]$, where function $Mdiff[H, Hca, Ho, dH] = FH[H, Hca, +Ho] - FH[H, Hca, -Ho]$ The scaled sensitive-axis output is defined as:

$$\text{Scaled Sensitive-Axis Output} = Hsen$$
$$= (2*dH) \cdot \frac{Mdiff[H, \ldots, dH]}{Gdiff[H, \ldots, dH]}$$
$$\approx H$$

By analogy, both the 'Vmag_diff' and 'Hsen' output functions can be visualized as having a "spine" running along the sensitive-axis, out of which quadratic "ribs" emanate in the cross-axis direction:

$Vmag\_diff[H, Hca] \cong SpineMdif[H] + RibMdif[H]Hca^2$, and $Hsen[H, Hca] \cong SpineHsen[H] + RibHsen[H]Hca^2$ The 'Spine[ ]' functions (ideally equal to 'H') describe the shape of the sensitive-axis spine, and the 'Rib[ ]' functions (ideally zero) describe how far the ribs extend above or below the spine.

To calibrate the SET–RESET magnetic output, a calibration by "excursion" is done by comparing values for 'Vmag_diff' at two equal-but-opposite sensitive-axis field excursions, with the cross-axis field equaling zero. The calibration constant-of-proportionality equals:

$KMDIFF \cong (2Hcal)/(SpineMdif[+Hcal] - SpineMdif[-Hcal])$

The calibrated SET–RESET magnetic output equals:

Calibrated '$Vmag\_dif$' $= KMDIFF \times Vmag\_diff = KMDIFF(SpineMdif[H] + RibMdif[H]Hca^2)$ A calibration by 'excursion' is also done for 'Hsen' to account for its small non-linearities at the maximum field excursion points. The calibration constant, 'KMSENS', is close to unity:

$KMSENS \cong (2Hcal)/(SpineHsn[+Hcal] - SpineHsn[-Hcal])$

The calibrated sensitive-axis output equals:

Calibrated '$Hsen$' $= KMSENS \times$ '$Hsen$' $= KMSENS(SpineHsen[H] + RibHsen[H]Hca^2)$ The desired cross-term reduction equation is found by taking the quotient of the calibrated "rib" functions. Using the symbolic forms provided by the second magnetic form-factor approximation, the mathematical form for the cross-term reduction looks like:

$$\text{Xterm-Reduction } [H] \cong \frac{KMDIFF}{KHSENS} \cdot \left(\frac{RibMdif[H] \cdot Hca^2}{RibHsen[H] \cdot Hca^2}\right)$$
$$\cong -c0 + \frac{c1}{(dH^2 + c2 \cdot H^2)}$$

From this equation form, it can be inferred that; As 'H' goes to zero, the cross-term reduction is limited by 'dH'. Hence for small fields, the smaller the 'dH', the greater the cross-term reduction.

For larger 'H', the reduction decreases as the inverse square of 'H', or in a roughly logarithmic manner, regardless of the value of 'dH'.

Concerning sensitive-axis linearization, some insight can be gained by examining a series approximation for the 'spine' of 'Hsen':

$SpineHsen[H] \cong H + (Ho^{-2})H^3$

An inversion of this simple cubic series can be found by changing the 'H³' term to 'Hsen³' then solving for 'H'; this creates a linearizing function for 'Hsen':

$H_{Calibrated} \cong Hsen - (Ho^{-2}) \cdot Hsen^3$

More elaborate linearization schemes can be constructed both by numerical and symbolic techniques.

Figure 11A:
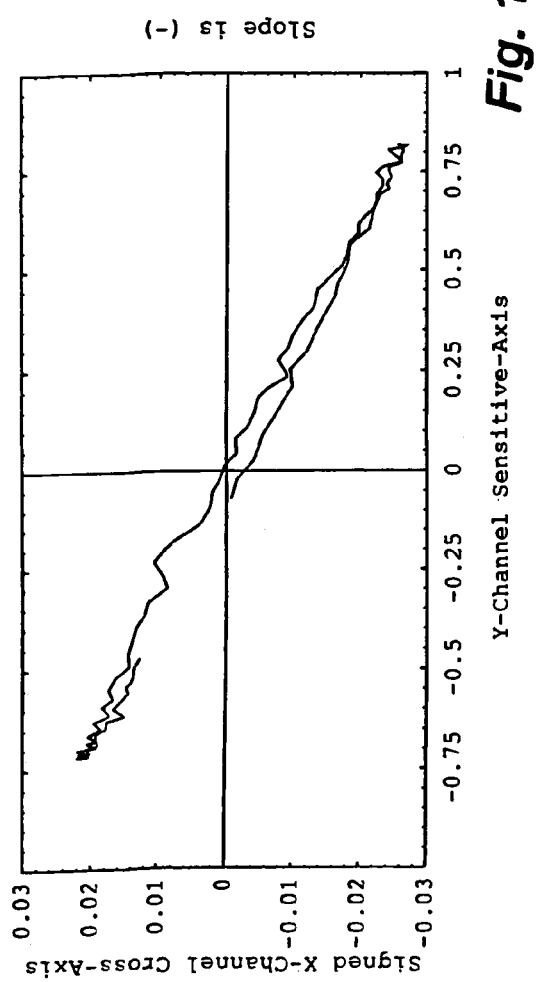
FIGS. 11A and 11B are plots of the X and Y-channel signed cross-axis outputs with respect to the sensitive-axis outputs of their sister channels and wherein the negative slope of FIG. 11A indicates the 'X' cross-axis points in the '−Y' direction and the positive slope of FIG. 11B indicates that the 'Y' cross-axis points in the '+X' direction.
Figure 11B:
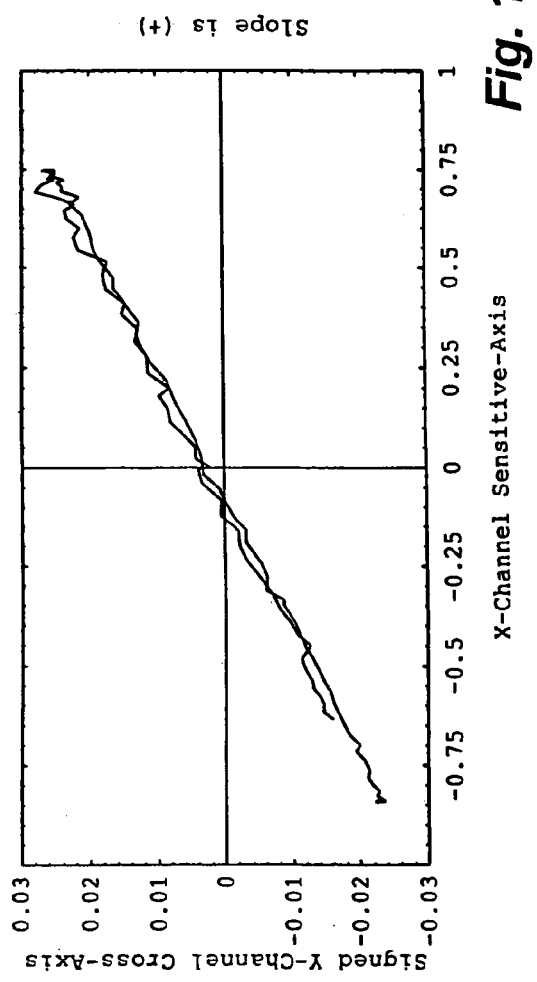

With reference additionally now to FIGS. 11A and 11B, an experimental validation of the SET-RESET gain normalization equations derived in accordance with the technique of the present invention is shown. In this experiment (performed at room-temperature, T≈25° C.) a Honeywell HMC1002 MR dual-axis sensor (1 MR bridge/axis) was rotated through 360 degrees (at. level) in the Earth's magnetic field while recording the SET-RESET magnetic channel output along with both the SET and RESET gains for each axis. From this data, one would hypothesize that after calculating both the sensitive and cross-axis outputs for each axis, one could determine for each MR chip:

The cross (insensitive) axis direction;

The sensor constant, 'Ho';

The OFFSET strap field, 'dH'; and

The sensor OFFSET strap current-to-field conversion constant, denominated 'OFFSET Field' by the Honeywell Datasheet, given that the OFFSET strap current, 'Iofst', equals 6 milliamperes.

It is generally known that the horizontal magnetic field for the experiment location (i.e. Denver, Colo.) is substantially 0.2 Gauss.

The AN-205 application note indicates a nominal value for 'Ho' of 8.0 Oersted, which is, equivalent to 8.0 Gauss in free-air.

The constant 'dH' is related to both the OFFSET strap current and the OFFSET current-to-field conversion constant, which is nominally specified by the Honeywell Datasheet at 51 milliamperes/Gauss. The formula needed to calculate this conversion constant is:

OFFSET Field=$Iofst/dH$

It should be noted that in this particular experiment, forty SET–RESET magnetic measurements ('N'=40) and ten SET and RESET gain measurements ('M'=10) were taken per 0.1 second block, but this rate was determined solely by the interrupt overhead of the microprocessor in use in the particular embodiment under test (e.g. a Mapstar™ II compass)

Assuming that the XY MR chips are orthogonal to each other, the sensitive-axis output of each chip should be proportional to the cross-axis output of the other as they are both rotated in the Earth's magnetic field. Therefore plotting the cross-axis output of each sensor against the sensitive-axis output of its sister-chip should reveal whether the cross-axis direction is parallel (+slope) or anti-parallel (−slope) to the sister chip's sensitive-axis.

The sensitive-axis output for each sensor is found using the following formula, which takes into account the unequal number (required to find a correct 'dH') of output versus gain samples per sampling period:

$$Usen \cong \frac{H}{(2 \cdot dH)} = \frac{10}{40} \cdot \frac{\sum_1^{40}(\text{Set Outputs}) - \sum_1^{40}(\text{Reset Outputs})}{\sum_1^{10}(\text{Set Gains}) - \sum_1^{10}(\text{Reset Gains})}$$

The cross-axis output for each sensor is negated in order to give a positive constant-of-proportionality, which will prove less confusing when determining cross-axis direction and finding 'Ho':

$$Ucross \cong \frac{Hca}{(+Ho)}$$
$$= -\frac{Hca}{(-Ho)}$$
$$= -\frac{\sum(\text{Set Gains}) + \sum(\text{Reset Gains})}{\sum(\text{Set Gains}) - \sum(\text{Reset Gains})}$$

With particular reference to FIG. 11A, the negative-slope of the X-channel cross-axis versus Y-channel sensitive-axis plot indicates that the X-channel cross-axis points in the (−Y) axis direction.

Conversely, with particular reference to FIG. 11B, the positive-slope of the Y-channel cross-axis versus X-channel sensitive-axis output plot indicates that the Y-channel cross-axis points in the (+X) axis direction.

Knowing that for the Mapstar™ II compass:

The (+Y) chip sensitive-axis points to the LEFT of the forward-looking (+X) chip; and The (+X) chip sensitive-axis points to the RIGHT of the forward-looking (+Y) chip;

The cross-axis direction for both chips is to the RIGHT of a forward-looking sensitive-axis. This was expected, as similar sister chips must have identical cross-axis directions.

Again with particular reference to FIGS. 11A and 11B, knowledge that each plot projection onto either a sensitive or cross-axis is associated with a 0.4 Gauss change (due to the rotation) allows for the calculation of both 'dH' and 'Ho':

'dH_X'≅(0.4 Gauss/X Sensitive-axis Excursion)/2=
  (0.4 Gauss/1.591)≅0.126 Gauss 'Ho_X'≅(0.4 Gauss/X Cross-axis Excursion)=(0.4
  Gauss/0.04902)≅8.16 Gauss 'dH_Y'≅(0.4 Gauss/Y Sensitive-axis Excursion)/2

=(0.4 Gauss/1.583)≅0.130 Gauss

'Ho_Y'≅(0.4 Gauss/Y Cross-axis Excursion)=(0.4
  Gauss/0.05166)≅7.74 Gauss

The calculated 'OFFSET Field' values are:

'OFFSET Field_X'=Iofst/dH_X=(6 mA/0.126
  Gauss)≅47.6 mA/Gauss

'OFFSET Field_Y'=Iofst/dH_X=(6 mA/0.130
  Gauss)≅46.2 mA/Gauss

All the values calculated for 'Ho' and 'OFFSET Field' are consistent with the AN-205 reference and Honeywell Datasheet.

Figure 12A:
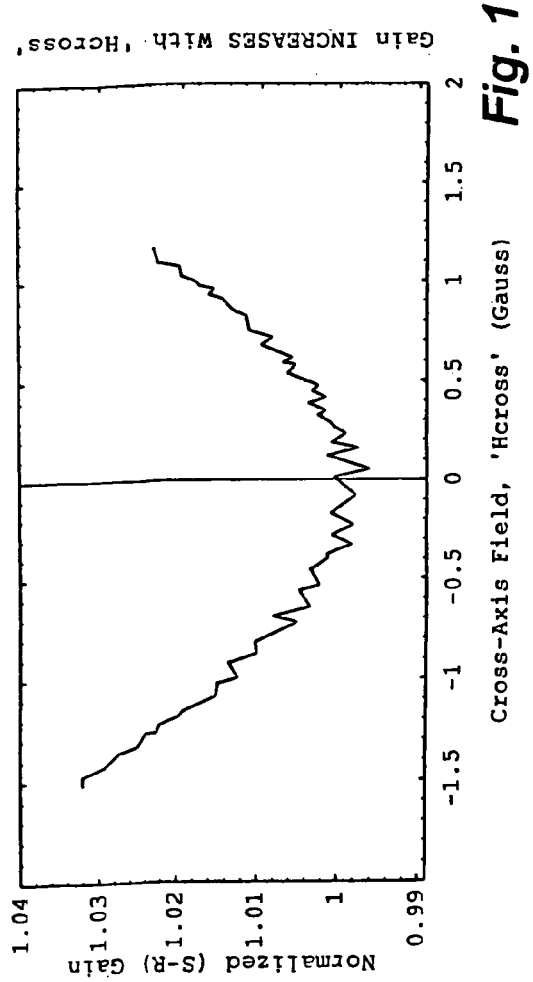
Figure 12B:
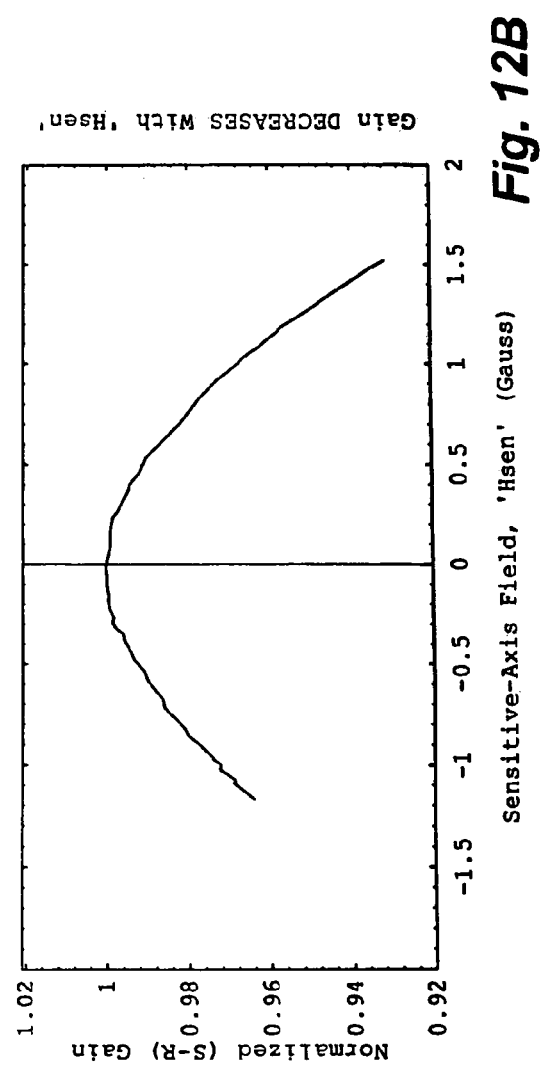

With reference additionally now to FIGS. 12A and 12B, a further experimental validation of the SET-RESET gain normalization equations derived in accordance with the technique of the present invention is shown wherein the fine features of the magnetic form factor are checked. The experimental set up comprised:

Placing the HMC1002 MR dual-axis sensor in a small Helmholtz coil, with the Y-axis MR bridge (chip) aligned with the coil axis;

Aligning the Helmholtz coil axis roughly to magnetic North;

Energizing the coil, and adjusting the MR sensor board position to maximize the Y-axis signal; and De-energizing the coil, and then adjusting the Helmholtz coil direction to minimize the X-axis signal.

With this alignment, most of the signal developed by the Y-axis chip will be due to its sensitive axis. Conversely, most of the signal developed by the X-axis chip will be due to its cross-axis field; which is reported by the negated sensitive-axis output of the Y-chip.

After completing the sensor board alignment, the Helmholtz coil current was slowly swept to generate a Y-axis field of approximately −1.2 to +1.5 Gauss. During the sweep, the SET-RESET magnetic channel output along with both the SET and RESET gains for each axis were recorded at room-temperature, T≈25° C.

As before, forty SET-RESET magnetic measurements ('N'=40) and ten SET and RESET gain measurements ('M'=10) were taken per 0.1 second block, but this rate was determined solely by the interrupt overhead of the microprocessor in use in the particular embodiment under test (e.g. a Mapstar™ II compass).

The Y-channel scaled sensitive-axis output was determined using the following formula, assuming a default value of (6 mA×(1 Gauss/51 mA))=0.12 Gauss for 'dH':

$$Hsen\_Y \approx H = \frac{10}{40} \cdot (2 \cdot dH) \cdot \frac{\sum_1^{40}(\text{Set Outputs}) - \sum_1^{40}(\text{Reset Outputs})}{\sum_1^{10}(\text{Set Gains}) - \sum_1^{10}(\text{Reset Gains})}$$

With reference additionally now to FIG. 12A, a quadratic least squares (LSQ) fit was done to determine the X-axis SET-RESET gain variation with the negative of the scaled Y-axis sensitive output, which reports the X-chip cross-axis field. After normalization by the LSQ 'constant' coefficient, the normalized SET-RESET gain was plotted against the reported cross-axis field. This plot is illustrative of the fact that SET-RESET gain increases with cross-axis field. Computationally, the LSQ fit shows:

Normalized S–R Gain≅(5120.6+78.01$Hca^2$)/5120.6

(1+65.643$^{-1}Hca^2$)

The measured versus calculated values for the inverse of the normalized quadratic term are:

65.643 versus $(Ho^2)^{-1}=(8^2)^{-1}=64$

With reference additionally now to FIG. 12B, a second quadratic least squares (LSQ) fit was done to determine the Y-axis SET–RESET gain variation with the scaled Y-axis sensitive output. The normalized SET–RESET gain was then plotted against the reported sensitive-axis field. The resultant plot was also illustrative of the fact that SET–RESET gain decreases with sensitive-axis field. Mathematically:

Normalized S–R Gain≅(5406.5+161.25 $Hca^2$)/5406.5

(1−33.53$^{-1}Hca^2$)

The measured versus calculated values for the inverse of the normalized quadratic term are:

−33.53 versus $(−2/3)(Ho^2)^{-1}=(0.667)(8^2)^{-1}=−42.67$

What has been provided, therefore, is a measurement technique for normalizing the sensitive-axis output of a magnetoresistive (MR) sensor which greatly reduces both temperature effects and magnetic contributions from the insensitive-axis cross-terms. As described herein, the normalization techniques disclosed may be effectuated by direct measurement with no prior knowledge of the sensor constants being required and may be performed for a single sensor with multiple sensors also not being required in order to estimate the cross-axis fields for each of the other sensors. The techniques disclosed provide an output proportional to the insensitive-axis field as well as that of the sensitive-axis and, when combined with knowledge of ambient field strengths, can be used to determine fundamental MR sensor constants which then allows for correction of higher-order sensor non-linearities. The techniques disclosed are particularly conducive to low power supply availability applications such as, for example, those encountered with battery powered equipment.

The above description is based on devices utilizing a standard two or three chip arrangement to provide output for the x-axis and the y-axis (and optionally the z-axis). Using the following described techniques, however, the inventor realized that the algorithms for calibrating a 2-chip (1-chip per axis) compass apply directly to making and/or operating a 1-chip compass (or other MR device). As will be described below in detail, the synthesis of a cross axis can be used to generate a second axis similar to that of a second chip, and significantly, a 1-chip compass or MR device can be produced using the techniques of the present invention with 0.5 to 1 degree accuracy (e.g., at 0.2 Gauss horizontal field strength). Hence, a 1-chip compass or MR device has accuracy highly suitable for many lower accuracy applications, such as the navigational compass of an automobile or the like.

To demonstrate the calibration and accuracy evaluation for both 1 and 2-chip compass systems, a Mapstar™ II compass containing a HMC1002 dual-axis sensor was mounted on a theodolite, then rotated 360 degrees (at level) in the Earth's magnetic field. At approximately 10 degree increments, reference angles provided by the theodolite were paired with magnetic data from the HMC1002 sensor and written to a data file, for a total of N=37 points-per-file. Afterwards, both sensitive and cross-axis outputs were calculated for the individual X and Y chips contained within the HMC1002 sensor. This procedure was repeated for several compasses, and a representative run was selected for this example.

Mathematically, our calibration models either a sensitive or synthesized cross-axis output by the vector DOT-PRODUCT of the applied magnetic field with a vector aligned with output axis direction:

Magnetic Output=$Hhorz*Sf*Cos[ag+ph]$ where:

'ag' is the clockwise angle of rotation from magnetic north;

'Hhorz' is the horizontal magnetic-field magnitude;

'Sf' is an axis sensitivity factor; and

'ph' is a phase which sets axis direction.

An ideal 2-chip compass utilizes the sensitive-axis outputs of separate X and Y sensors whose axis phasing is 90 degrees apart or orthogonal:

$Hx = Hhorz*SfSx*Cos[ag+0]$, and $Hy = Hhorz*SfSy*Cos[ag+Pi/2]$ $= Hhorz*SfSy*Sin[ag+0]$ Plotting these outputs against each other would result in an ellipse, as the axes scale factors, 'SfSx' and 'SfSy' generally are not equal.

To model non-orthogonality, small phase adjustments are added to change the axes directions:

$Hx=Hhorz*SfSx*Cos[ag+ph1]$ and $Hy=Hhorz*SfSy*Sin[ag+ph2]$, where 'ph1' and 'ph2' are small and non-zero.

Plotting non-orthogonal outputs against each other results in a 'tilted' ellipse, with the degree of tilt reflecting the amount of axis non-orthogonality.

Figure 13A:
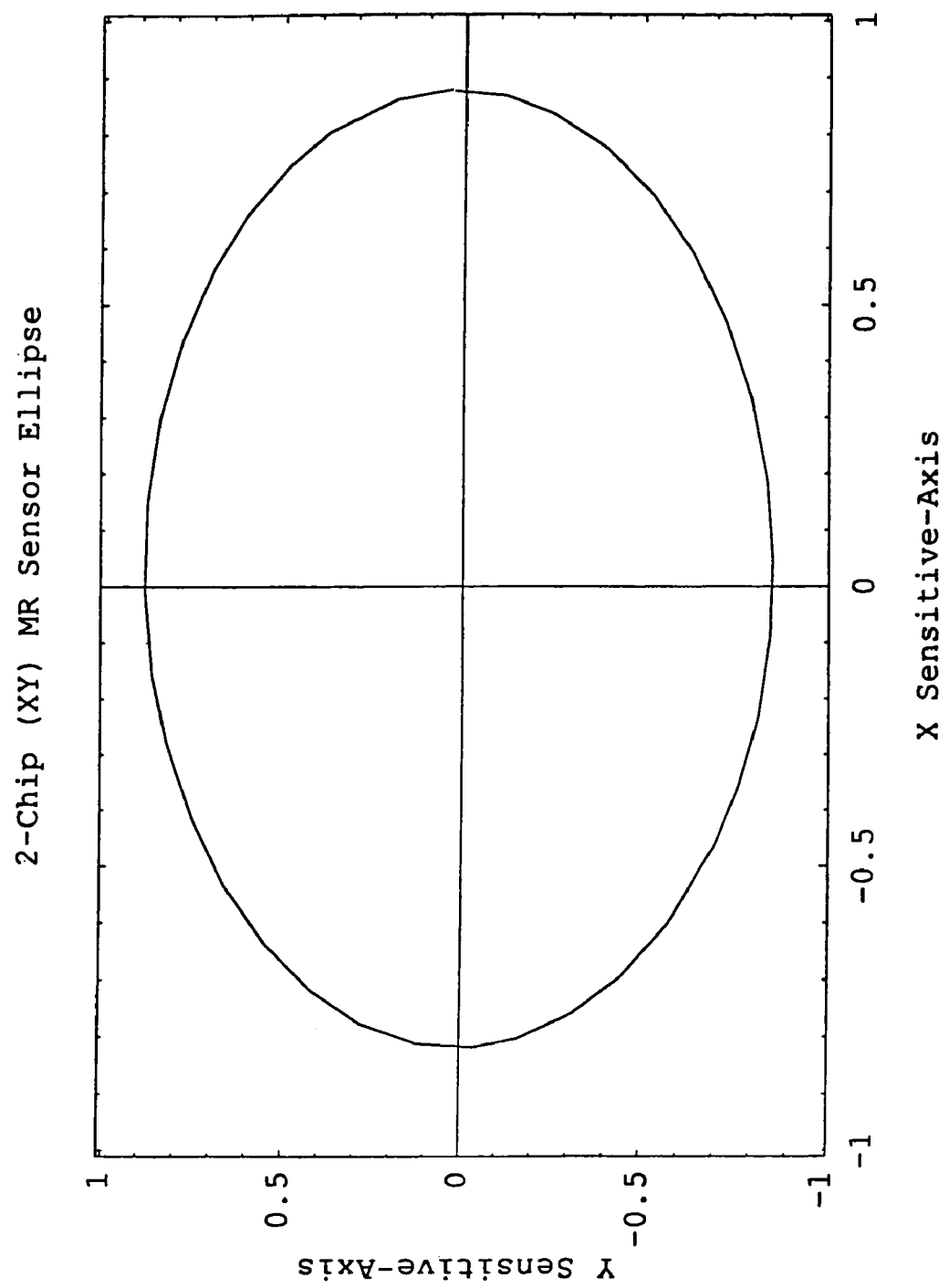
FIG. 13A shows the sensitive axes of two orthogonal MR chips plotted together, which generates an ellipse typically seen for a 2-chip compass.
Figure 13B:
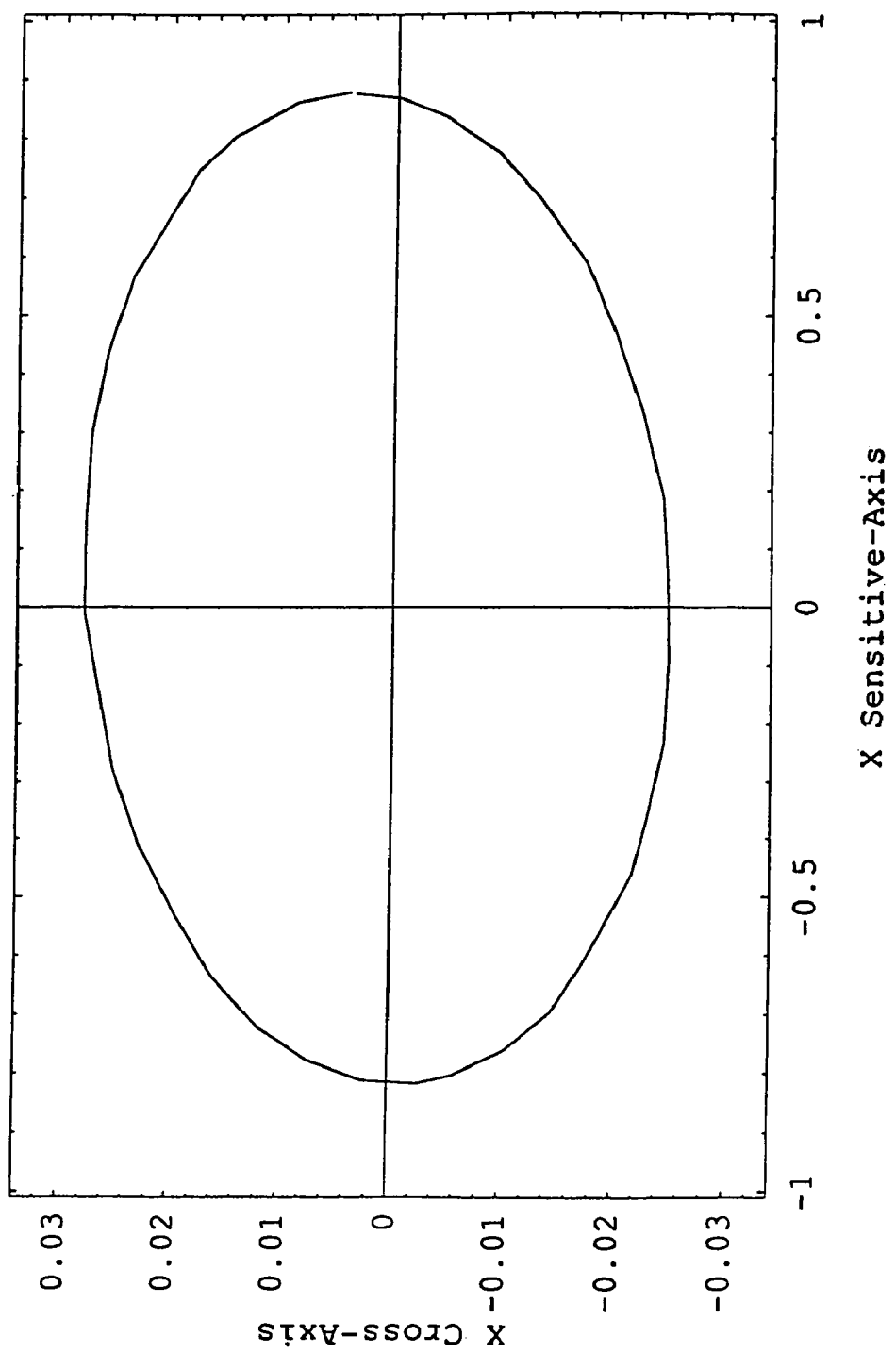
FIGS. 13B and 13C are plots for the individual X and Y chips within the 2-chip device showing the sensitive-axis versus synthesized cross-axis output for each chip. These figures illustrate that a 1-chip compass provides an elliptical output similar to that produced by a 2-chip device.
Figure 13C:
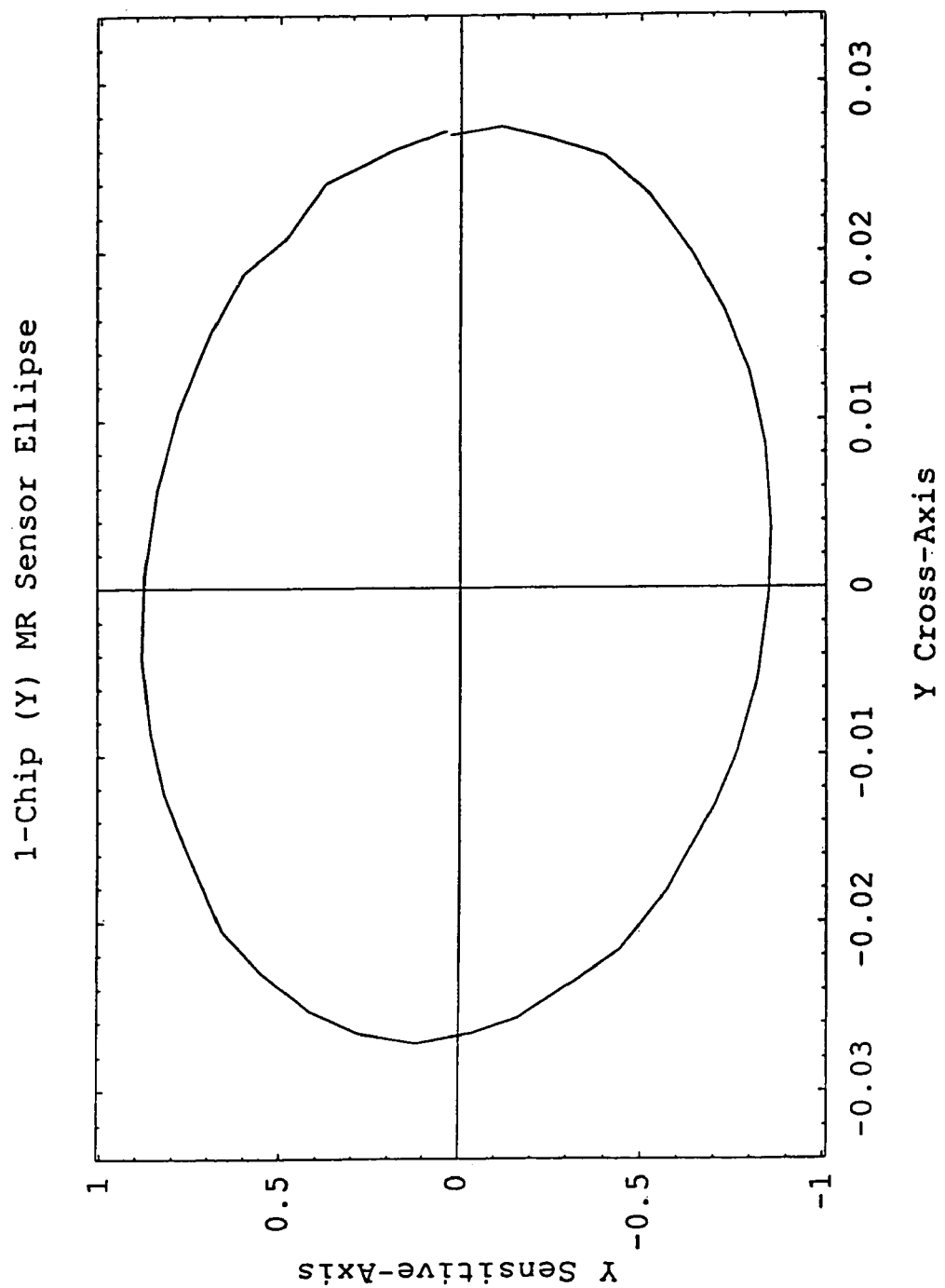

FIG. 13A shows the sensitive-axis XY outputs against each other for the example HMC1002 dual-axis sensor, which represents a typical 2-chip compass. The plot axes scales are nearly equal, as would be expected for similar sensors, and the small degree ellipse tilt indicates that the X and Y chip axis directions are nearly orthogonal. Similar plots of the sensitive versus the synthesized cross-axis outputs for the INDIVIDUAL X and Y chips, as seen in FIGS. 13B and 13C, yield similar ellipses. This illustrates not only that a 1-chip compass can be achieved according to the techniques of the present invention, but a 1-chip compass can be also calibrated using algorithms identical to those used for 2-chip compasses.

The amount of tilt for the ellipses shown in FIGS. 13B and 13C, however, indicates a greater degree of axis non-orthogonality than seen for typical 2-chip compasses. Although unexpected (and ultimately traced to manufacturing process variations), this non-orthogonality is easily accounted for during calibration. Also, the plot scales for FIGS. 13B and 13C differ significantly from each other because the synthesized cross-axis output is typically 'Ho/2dH' times smaller (about 33 times for the HMC1002 chips) than the sensitive-axis output. Hence, preferred embodiments of 1-chip compasses preferably will seek to minimize or at least reduce or control 'Ho' (but, typically, at the expense of linearity) to increase cross-axis output and overall sensitivity. As the calibration techniques used for 1-chip compasses allow for the ready determination of 'dH' and 'Ho', both of which are useful in correcting non-linearities, the impact of a lower 'Ho' should not be significant.

Normally the algorithms used in compass field calibrations DO NOT rely on measured angles, and for this reason tend to be complex. Since reference angles are available, however, an easy method of calibration is to simply perform a Fourier analysis (using LSQ techniques) on the magnetic components outputs. This allows for both the determination of axis scale-factors and phases, which describe both 1 and 2-chip compasses in the described model.

As the equations which describe the LSQ fit are readily described in matrix notation, the experimental data is first organized into five (N×1) column vectors:

AG={ag1, ag2, . . . , agn} Reference angles
XS={xs1, xs2, . . . , xsn} X-chip sensitive-axis data
XC={xc1, xc2, . . . , xcn} X-chip cross-axis data
YS={ys1, ys2, . . . , ysn} Y-chip sensitive-axis data
YC={yc1, yc2, . . . , ycn} Y-chip cross-axis Along with a constant vector, both cosine and sine vectors are generated using the reference angles, again all of dimension (N×1):

KV={1, 1, . . . , 1} A vector of ones
CV={Cos[ag1], Cos[ag2], . . . , Cos[agn]} Cosines
SV={Sin[ag1], Sin[ag2], . . . , Sin[agn]} Sines The cosine and sine vectors are next multiplied by a scaling factor representing the local magnetic field magnitude and are combined with the constant vector into a (N×3) matrix denoted by 'X':

$$X=\{KV\!sf^{*}CV\!sf^{*}SV\},$$

where '*' denotes scalar multiplication. Note that scaling factor 'sf' can be set to unity if only angles are needed.

Another matrix, labeled 'MXT', is prepared from 'X' using the 'Transpose' and 'Inverse' matrix operations:

| XT = Transpose [X] | a (3 × N) matrix |
|---|---|
| MM = Inverse [XT.X] | a (3 × 3) matrix |
| MXT = MM.XT | a (3 × N) matrix |

Note here that '.' henceforth denotes either a vector dot-product or matrix multiplication.

Post-multiplying 'MXT' with a magnetic component vector generates a (3×1) Fourier coefficient vector, which represents the 'best-fit' linear combination of offset, cosine, and sine vectors which make up the magnetic component vector:

Best-Fit Magnetic

Component Vector=$Mcos^{*}CV+Msin^{*}SV+Ofst$, where {Ofst Mcos Msin}=MXT.{mag.component vector}

Since the HMC1002 sensor contains two MR chips, four separate magnetic component outputs are available for compass construction. The Fourier components for these axes are:

FXS={Oxs, Cxs, Sxs}=MXT.XS X-chip sensitive-axes coef's
FXC={Oxc, Cxc, Sxc}=MXT.XC X-chip cross-axis coef's
FYS={Oys, Cys, Sys}=MXT.YS Y-chip sensitive-axis coef's
FYC={Oyc, Cyc, Syc}=MXT.YC Y-chip cross-axis coef's.

Construction begins by re-arranging the Fourier coefficients of two orthogonal (or nearly so) axes to form a (2×2) scaling matrix and a (2×1) offset vector, which are now defined for our three compass systems of interest:

a) 2-chip (XY) compass: vectors FXS and FYS are used
CC2={Cxs Sxs Cys Sys} and OFST2={Oxs, Oys}
b) 1-chip (X) compass: vectors FXS and FXC are used
CCx={Cxs Sxs Cxc Sxc} and OFSTx={Oxs, Oxc}
c) 1-chip (Y) compass: vectors FYS and FYC are used
Ccy={Cys Sys Cyc Syc} and OPSTy={Oxs, Oxc}

A 4th compass system could be constructed from the synthesized X and Y chip cross-axis components but is not done so for this example.

For each compass under consideration, the scaling matrix and corresponding offset vector form a linear system which describe the selected magnetic component outputs in terms of reference angles:

$$\{xval, yval\} = CC \cdot \{Cos[ag], Sin[ag]\} + OFST$$

Inverting this linear system gives 'best-fit' cosine/sine pairs in terms of magnetic components:

$$\{Cos[ag], Sin[ag]\} = Inverse[CC] \cdot \{xval, yval\} - Inverse[CC] \cdot OFST$$

These 'best-fit' cos/sin pairs are then used to find angles via a 4-quadrant ArcTan function:

Best-fit angle=ArcTan2 [{Cos[ag], Sin[ag]}]

Finally, the angular differences between the best-fit angles and the reference angle list are computed to determine how well the selected compass system can be calibrated.

Figure 14A:
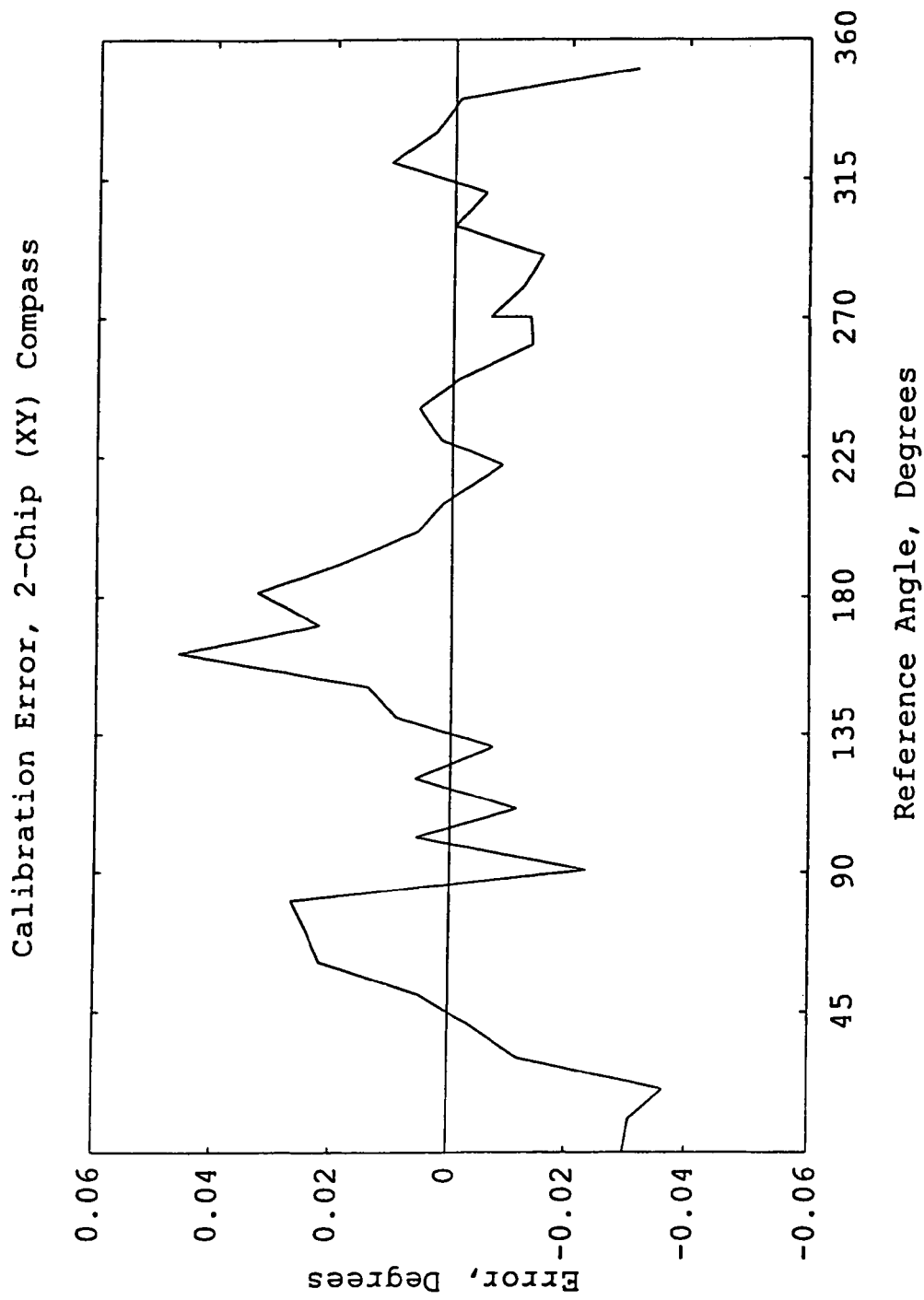
FIGS. 14A–14C illustrate calibration plots for 2-chip, X-chip, and Y-chip compasses of the present invention plotting degree error versus reference angles.
Figure 14B:
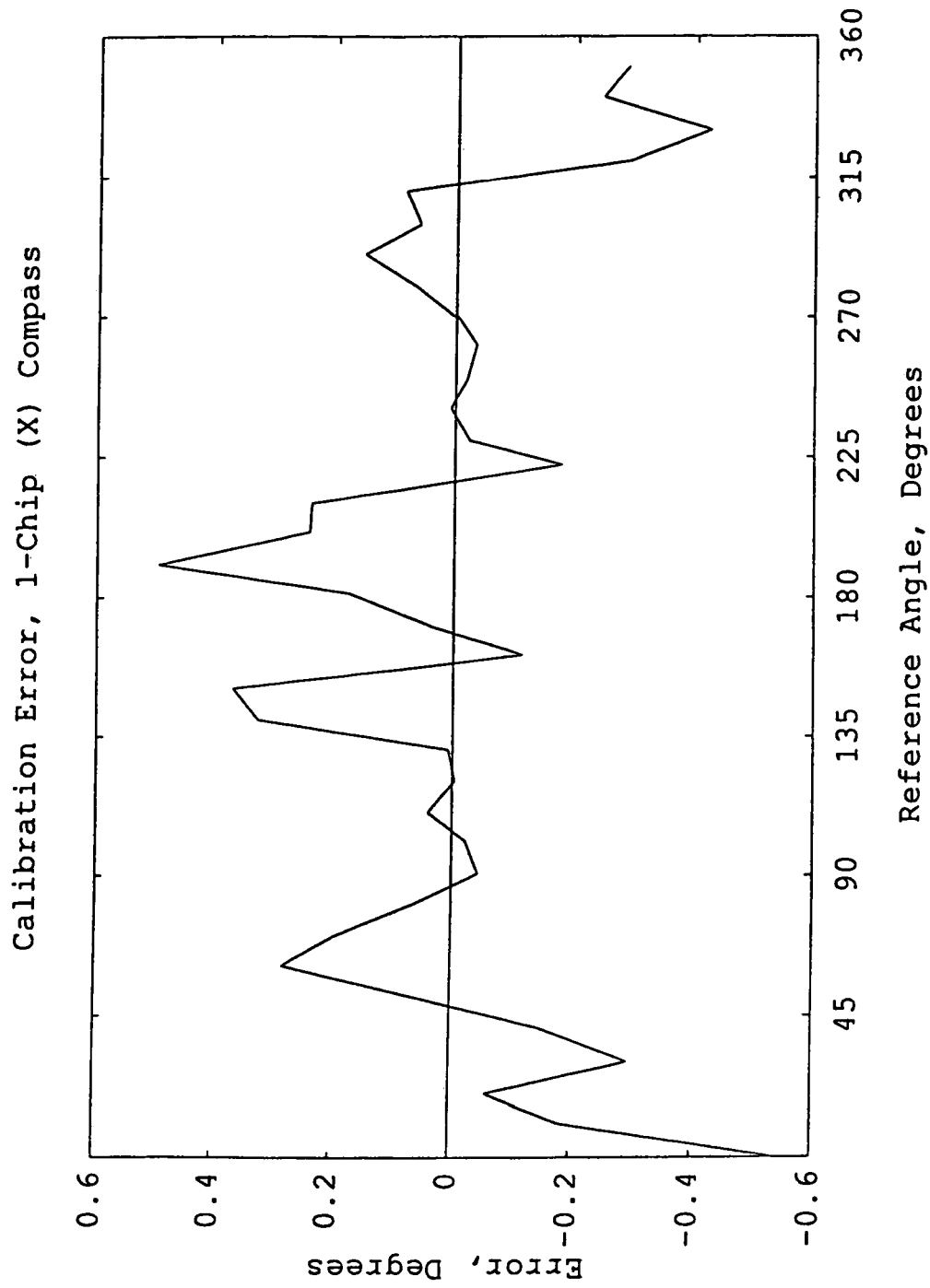
Figure 14C:
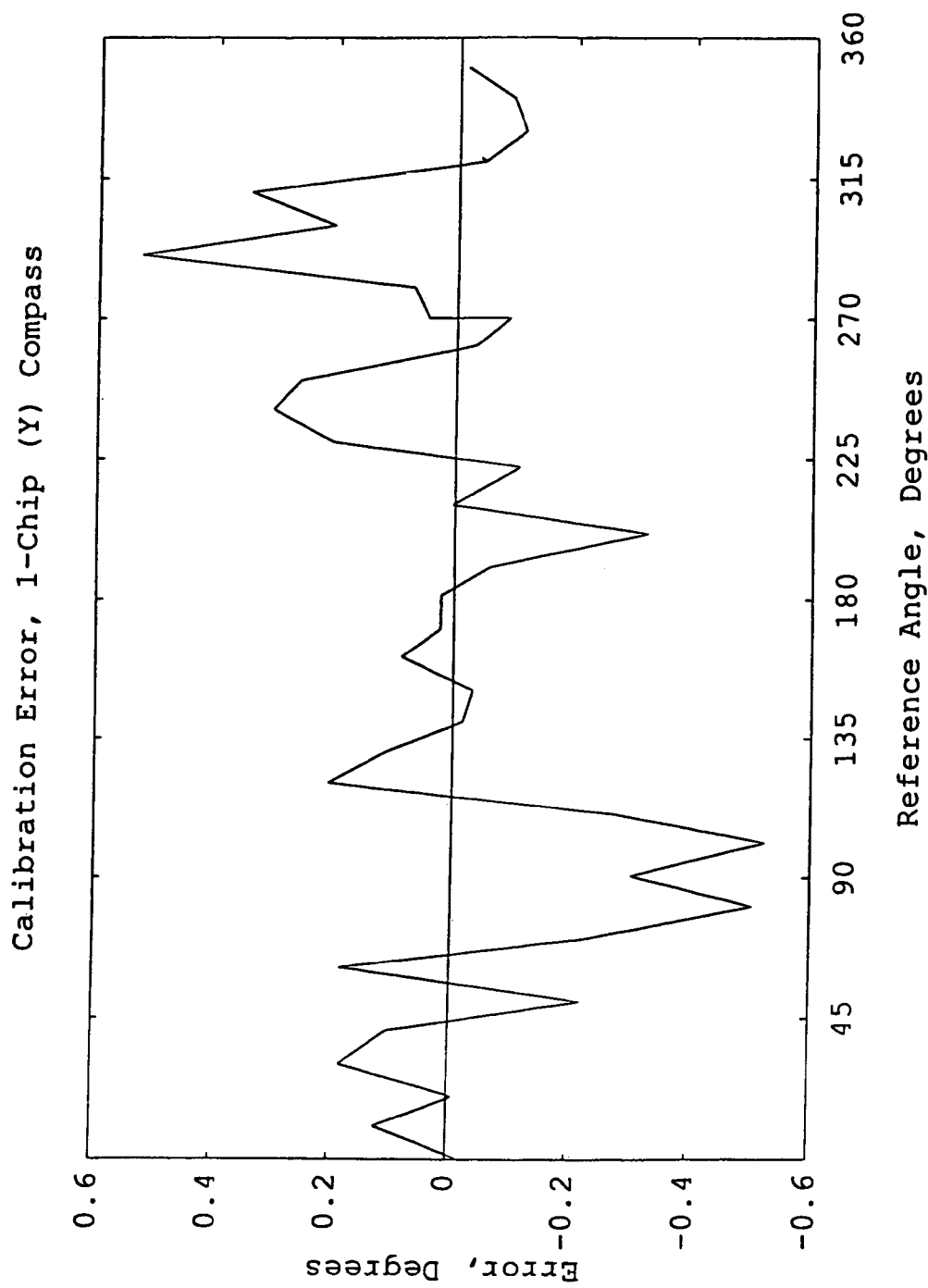

In this example calibration, FIGS. 14A, 14B, and 14C illustrate calibration error plots for representative 2-chip (XY), 1-chip (X), and 1-chip (Y) compasses, respectively. As can be seen from the plots, accuracy is higher in the 2-chip device, i.e., about plus or minus 0.02 to 0.05 degrees. Significantly, the 1-chip devices also provide reasonable accuracy, i.e., about plus or minus 0.5 degrees, which is acceptable in many compass applications. Further statistical analysis on all the calibration runs was performed and showed that the Root-Mean-Square (RMS) accuracy for the 2-chip compasses was about 0.06 degrees while the RMS accuracy for the 1-chip compasses (i.e., the X-chip and the Y-chip of the HMC1002 device) was about 0.6 degrees. Hence, this experiment shows that the techniques of the present invention can be implemented to provide a 1-chip compass with accuracy of about 1 degree or less (i.e., 0.6 degrees and in some cases, higher accuracy can be achieved).

Sensor constants for each individual MR chip can also be derived from the Fourier coefficients, providing that the scaling factor 'sf' was set to the local horizontal field magnitude during the calculation of 'X':

$$dHx = (1/2)^{*}Sqrt[Cxs^{\wedge}2 + Sxs^{\wedge}2] X\text{-chip 'dH'}$$

$$Hox = Sqrt[Cxc^{\wedge}2 + Sxc^{\wedge}2] X\text{-chip}$$

'effective Ho'

$$dHy = (1/2)^{*}Sqrt[Cys^{\wedge}2 + Sys^{\wedge}2] Y\text{-chip 'dH'}$$

$$Hoy = Sqrt[Cyc^{\wedge}2 + Syc^{\wedge}2] Y\text{-chip}$$

'effective Ho'

Given an experimentally determined horizontal ambient field of Hhorz=0.2198 Gauss, the 'dH' and effective 'Ho' values calculated for both MR chips contained within the representative HMC1002 device were {dHx, Hox}={0.1293, 7.968}, and
{dHy, Hoy}={0.1252, 7.789}, respectively.

These values compare favorably with a nominal calculated 'dH' value of 0.122 Gauss, and a nominal quoted 'Ho' value of 8.0 Gauss, which is provided by the AN-205 reference. Hence, the 1-chip compass provides a relatively accurate MR device that can readily be calibrated to further improve compassing results.

While there have been described above the principles of the present invention in conjunction with specific circuit implementations and sensor technologies, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein.

It is likely that 1-chip compasses will drift due to temperature more than 2-chip compasses due to variations in 'Ho', but the amount of drift should not significantly affect accuracy results of the 1-chip compasses. Additionally, the temperature dependency of 'dH' can be precisely set for the 1-chip compass using hardware to better control the 1-chip accuracy or outputs.

Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and, whether or not it mitigates any or all of the same technical problems as confronted by the present invention.

What is claimed is:

1. A method for operating one chip of a magnetic sensor having SET/RESET field generating elements as a compass, comprising:
    collecting output of a sensitive axis of the one chip of the magnetic sensor;
    determining a cross-axis output of the one chip of the magnetic sensor; and
    performing a compassing computation using the sensitive axis output and the cross-axis output as first and second sensitive axis inputs, respectively.

2. The method of claim 1, wherein the determining of the cross-axis output comprises:
    sampling a number of SET gains of the sensor to produce a first sum;
    sampling a number of RESET gains of the sensor to produce a second sum;
    adding the first sum to the second sum to produce a first result;
    subtracting the second sum from the first sum to produce a second result; and
    dividing the first result by the second result.

3. The method of claim 1, further comprising normalizing the output of the sensitive axis, comprising:
    sampling a number of SET outputs of said sensor to produce a first sum;
    sampling a number of RESET outputs of said sensor to produce a second sum;
    sampling a number of SET gains of said sensor to produce a third sum;
    sampling a number of RESET gains of said sensor to produce a fourth sum;
    subtracting said second sum from said first sum to produce a first result;
    subtracting said fourth sum from said third-sum to produce a second result; and
    dividing said first result by said second result.

4. The method of claim 3, wherein the normalizing further comprises dividing the magnetic field (H) by the quantity (2*dH).

5. The method of claim 3, wherein the number of SET outputs, RESET outputs, SET gains and RESET gains is at least one.

6. The method of claim 1, wherein the compassing computation has an accuracy in the range of about 0.5 degrees to about 1 degree.

7. The method of claim 1, wherein the magnetic sensor further comprises OFFSET field generating elements and the method further comprises normalizing the output of the sensitive axis, the normalizing comprising:
    furnishing a pulse having a first direction to the SET/RESET field generating elements to establish a SET magnetic state;
    sampling an output of the magnetic sensor to establish a SET magnetic output;
    providing a pulse having the first direction to the OFFSET field generating element;
    sampling the output of the magnetic sensor to establish a first sample;
    providing another pulse having a second direction opposite to the first direction to the OFFSET-field generating element;
    further sampling the output of the magnetic sensor to establish a second sample; and
    subtracting the second sample from the first sample to establish a SET gain.

8. The method of claim 7, wherein the act of furnishing a pulse having a first direction to the SET/RESET field generating elements is carried out by applying a positive-going current pulse.

9. The method of claim 7, wherein the act of providing a pulse having a first direction to the OFFSET field generating elements is carried out by applying a positive-going current pulse.

10. The method of claim 7, wherein the act of providing another pulse having a second direction opposite to the first direction to the OFFSET field generating elements is carried out by applying a negative-going current pulse.

11. The method of claim 7, wherein the acts of sampling the output of said magnetic sensor are carried out by means of an A/D converter.

12. The method of claim 7, wherein said acts of sampling an output of said magnetic sensor to establish said SET magnetic output through subtracting said second sample from said first sample to establish said SET gain are repeated at least one additional time.

13. The method of claim 7, further comprising:
    providing a pulse having a second direction opposite to said first direction to said SET/RESET field generating element to establish a RESET magnetic state.

14. The method of claim 13, wherein said acts of providing said pulses having a first and second direction to said SET/RESET field generating elements to establish respective SET and RESET magnetic state are carried alternately.

15. A circuit for use as a 1-chip compass, comprising:
a magnetoresistive (MR) sensor having first and second terminals, the MR sensor comprising a sensitive axis and a cross axis;
SET/RESET field generating elements disposed at a first location with respect to said MR sensor;
OFFSET field generating elements disposed at a second location with respect to said MR sensor so as to generate a field orthogonal to that generated by said SET/RESET field generating elements;
an amplifier coupled to said first and second terminals of said MR sensor and having an output thereof;
an A/D converter coupled to said output of said amplifier for producing a control signal;
a SET/RESET pulse generator coupled to said SET/RESET field generating elements;
an OFFSET generator coupled to said OFFSET field generating elements; and
a control block receiving said control signal from said A/D converter and providing control output signals to said SET/RESET pulse generator and said OFFSET generator, the control block further performing compassing processes based on output for the sensitive axis and output determined for the cross-axis.

16. The circuit of claim 15, wherein the control block determines the cross-axis output by:
sampling a number of SET gains of the MR sensor to produce a first sum;
sampling a number of RESET gains of the MR sensor to produce a second sum;
adding the first sum to the second sum to produce a first result;
subtracting the second sum from the first sum to produce a second result; and
dividing the first result by the second result.

17. The circuit of claim 15, wherein the control block normalizes the output of the sensitive axis, the normalizing comprising:
sampling a number of SET outputs of said sensor to produce a first sum;
sampling a number of RESET outputs of said sensor to produce a second sum;
sampling a number of SET gains of said sensor to produce a third sum;
sampling a number of RESET gains of said sensor to produce a fourth sum;
subtracting said second sum from said first sum to produce a first result;
subtracting said fourth sum from said third sum to produce a second result; and
dividing said first result by said second result,
wherein the normalizing further comprises dividing the magnetic field (H) by the quantity (2*dH).

18. A one-chip compassing method, comprising:
providing an MR sensor having SET/RESET field generating elements and a sensitive axis;
collecting output of the MR sensor corresponding to the sensitive axis;
normalizing the collected sensitive axis output to compensate for temperature effects;
calculating cross-axis output for the MR sensor; and
performing compassing operations using the normalized sensitive axis output and the calculated cross-axis output of the MR sensor as first and second axis inputs.

19. The method of claim 18, wherein the calculating of the cross-axis output comprises:
sampling a number of SET gains of the sensor to produce a first sum;
sampling a number of RESET gains of the sensor to produce a second sum;
adding the first sum to the second sum to produce a first result;
subtracting the second sum from the first sum to produce a second result; and
dividing the first result by the second result.

20. The method of claim 18, wherein the normalizing of the output of the sensitive axis, comprises:
sampling a number of SET outputs of said sensor to produce a first sum;
sampling a number of RESET outputs of said sensor to produce a second sum;
sampling a number of SET gains of said sensor to produce a third sum;
sampling a number of RESET gains of said sensor to produce a fourth sum;
subtracting said second sum from said first sum to produce a first result;
subtracting said fourth sum from said third sum to produce a second result; and
dividing said first result by said second result,
wherein the normalizing further comprises dividing the magnetic field (H) by the quantity (2*dH).

* * * * *

UNITED STATES PATENT AND TRADEMARK OFFICE
CERTIFICATE OF CORRECTION

PATENT NO.        : 7,112,793 B2
APPLICATION NO. : 11/025740
DATED             : September 26, 2006
INVENTOR(S)       : Layne L. Wright It is certified that error appears in the above-identified patent and that said Letters Patent is hereby corrected as shown below:

On the title page, item (54),

ONE-CHIP COMPASS IMPLEMENTED USING MAGNETORESISTIVE (MR) SENSOR TEMPERATURE COMPENSATION AND MAGNETIC CROSS-TERM REDUCTION TECHNIQUES"

should be --ONE-CHIP COMPASS IMPLEMENTED USING MAGNETORESISTIVE (MR) SENSOR TEMPERATURE COMPENSATION AND MAGNETIC CROSS-TERM REDUCTION TECHNIQUE--

Column 26, line 31, "OFFSET-field should be --OFFSET field--

Signed and Sealed this

Second Day of January, 2007

JON W. DUDAS
*Director of the United States Patent and Trademark Office*